(12) United States Patent  
Master

(10) Patent No.: US 7,865,847 B2
(45) Date of Patent: *Jan. 4, 2011

(54) METHOD AND SYSTEM FOR CREATING AND PROGRAMMING AN ADAPTIVE COMPUTING ENGINE

(75) Inventor: Paul L. Master, Sunnyvale, CA (US)

(73) Assignee: QST Holdings, Inc., San Jose, CA (US)

( * ) Notice: Subject to any disclaimer, the term of this patent is extended or adjusted under 35 U.S.C. 154(b) by 387 days.

This patent is subject to a terminal disclaimer.

(21) Appl. No.: 12/011,340

(22) Filed: Jan. 25, 2008

(65) Prior Publication Data

US 2008/0134108 A1 Jun. 5, 2008

Related U.S. Application Data

(63) Continuation of application No. 10/437,800, filed on May 13, 2003, now Pat. No. 7,328,414.

(60) Provisional application No. 60/378,088, filed on May 13, 2002.

(51) Int. Cl.
*G06F 17/50* (2006.01)
(52) U.S. Cl. ............. 716/1; 716/4; 716/16; 716/17
(58) Field of Classification Search ............. 716/1, 716/4–5, 16–18; 703/2, 14–15, 21–22
See application file for complete search history.

(56) References Cited

U.S. PATENT DOCUMENTS

| 3,409,175 A | 11/1968 | Byrne |
| 3,666,143 A | 5/1972 | Weston |
| 3,938,639 A | 2/1976 | Birrell |
| 3,949,903 A | 4/1976 | Benasutti et al. |
| 3,960,298 A | 6/1976 | Birrell |

(Continued)

FOREIGN PATENT DOCUMENTS

DE 100 18 374 A1 10/2001

(Continued)

OTHER PUBLICATIONS

Adl-Tabatabai et al, "Code Reuse in an Optimizing Compiler," OOPSLA, ACM pp. 51-68 (1996).

(Continued)

*Primary Examiner*—Paul Dinh
(74) *Attorney, Agent, or Firm*—Nixon Peabody LLP

(57) ABSTRACT

A system and corresponding method for creating an adaptive computing engine (ACE) includes algorithmic elements, ACE building blocks, and creates a design for heterogeneous nodes to provide appropriate hardware circuit functions that implement the algorithmic elements. Creating the design includes selecting an initial set of the ACE building blocks. The system and corresponding method also optimizes the design by selecting a different set of the ACE building blocks that meets predetermined performance standards for the efficiency of the ACE when performance of the ACE is simulated. The ACE building block preferably belong to one of a plurality of building block types. Preferably, the system and method includes a profiler for providing code to simulate a hardware design that implements the algorithmic elements, for identifying hotspots in the code, and for creating the design based thereon.

21 Claims, 8 Drawing Sheets

U.S. PATENT DOCUMENTS

| | | |
|---|---|---|
| 3,967,062 A | 6/1976 | Dobias |
| 3,991,911 A | 11/1976 | Shannon et al. |
| 3,995,441 A | 12/1976 | McMillin |
| 4,076,145 A | 2/1978 | Zygiel |
| 4,143,793 A | 3/1979 | McMillin et al. |
| 4,172,669 A | 10/1979 | Edelbach |
| 4,174,872 A | 11/1979 | Fessler |
| 4,181,242 A | 1/1980 | Zygiel et al. |
| RE30,301 E | 6/1980 | Zygiel |
| 4,218,014 A | 8/1980 | Tracy |
| 4,222,972 A | 9/1980 | Caldwell |
| 4,237,536 A | 12/1980 | Enelow et al. |
| 4,252,253 A | 2/1981 | Shannon |
| 4,302,775 A | 11/1981 | Widergren et al. |
| 4,333,587 A | 6/1982 | Fessler et al. |
| 4,354,613 A | 10/1982 | Desai et al. |
| 4,377,246 A | 3/1983 | McMillin et al. |
| 4,380,046 A | 4/1983 | Frosch et al. |
| 4,393,468 A | 7/1983 | New |
| 4,413,752 A | 11/1983 | McMillin et al. |
| 4,458,584 A | 7/1984 | Annese et al. |
| 4,466,342 A | 8/1984 | Basile et al. |
| 4,475,448 A | 10/1984 | Shoaf et al. |
| 4,509,690 A | 4/1985 | Austin et al. |
| 4,520,950 A | 6/1985 | Jeans |
| 4,549,675 A | 10/1985 | Austin |
| 4,553,573 A | 11/1985 | McGarrah |
| 4,560,089 A | 12/1985 | McMillin et al. |
| 4,577,782 A | 3/1986 | Fessler |
| 4,578,799 A | 3/1986 | Scholl et al. |
| RE32,179 E | 6/1986 | Sedam et al. |
| 4,633,386 A | 12/1986 | Terepin et al. |
| 4,649,512 A | 3/1987 | Nukiyama |
| 4,658,988 A | 4/1987 | Hassell |
| 4,694,416 A | 9/1987 | Wheeler et al. |
| 4,711,374 A | 12/1987 | Gaunt et al. |
| 4,713,755 A | 12/1987 | Worley, Jr. et al. |
| 4,719,056 A | 1/1988 | Scott |
| 4,726,494 A | 2/1988 | Scott |
| 4,747,516 A | 5/1988 | Baker |
| 4,748,585 A | 5/1988 | Chiarulli et al. |
| 4,758,985 A | 7/1988 | Carter |
| 4,760,525 A | 7/1988 | Webb |
| 4,760,544 A | 7/1988 | Lamb |
| 4,765,513 A | 8/1988 | McMillin et al. |
| 4,766,548 A | 8/1988 | Cedrone et al. |
| 4,781,309 A | 11/1988 | Vogel |
| 4,800,492 A | 1/1989 | Johnson et al. |
| 4,811,214 A | 3/1989 | Nosenchuck et al. |
| 4,824,075 A | 4/1989 | Holzboog |
| 4,827,426 A | 5/1989 | Patton et al. |
| 4,850,269 A | 7/1989 | Hancock et al. |
| 4,856,684 A | 8/1989 | Gerstung |
| 4,870,302 A | 9/1989 | Freeman |
| 4,901,887 A | 2/1990 | Burton |
| 4,905,231 A | 2/1990 | Leung et al. |
| 4,921,315 A | 5/1990 | Metcalfe et al. |
| 4,930,666 A | 6/1990 | Rudick |
| 4,932,564 A | 6/1990 | Austin et al. |
| 4,936,488 A | 6/1990 | Austin |
| 4,937,019 A | 6/1990 | Scott |
| 4,960,261 A | 10/1990 | Scott et al. |
| 4,961,533 A | 10/1990 | Teller et al. |
| 4,967,340 A | 10/1990 | Dawes |
| 4,974,643 A | 12/1990 | Bennett et al. |
| 4,982,876 A | 1/1991 | Scott |
| 4,993,604 A | 2/1991 | Gaunt et al. |
| 5,007,560 A | 4/1991 | Sassak |
| 5,021,947 A | 6/1991 | Campbell et al. |
| 5,040,106 A | 8/1991 | Maag |
| 5,044,171 A | 9/1991 | Farkas |
| 5,090,015 A | 2/1992 | Dabbish et al. |
| 5,099,418 A | 3/1992 | Pian et al. |
| 5,129,549 A | 7/1992 | Austin |
| 5,139,708 A | 8/1992 | Scott |
| 5,144,166 A | 9/1992 | Camarota et al. |
| 5,156,301 A | 10/1992 | Hassell et al. |
| 5,156,871 A | 10/1992 | Goulet et al. |
| 5,165,023 A | 11/1992 | Gifford |
| 5,165,575 A | 11/1992 | Scott |
| 5,190,083 A | 3/1993 | Gupta et al. |
| 5,190,189 A | 3/1993 | Zimmer et al. |
| 5,193,151 A | 3/1993 | Jain |
| 5,193,718 A | 3/1993 | Hassell et al. |
| 5,202,993 A | 4/1993 | Tarsy et al. |
| 5,203,474 A | 4/1993 | Haynes |
| 5,218,240 A | 6/1993 | Camarota et al. |
| 5,240,144 A | 8/1993 | Feldman |
| 5,245,227 A | 9/1993 | Furtek et al. |
| 5,261,099 A | 11/1993 | Bigo et al. |
| 5,263,509 A | 11/1993 | Cherry et al. |
| 5,269,442 A | 12/1993 | Vogel |
| 5,280,711 A | 1/1994 | Motta et al. |
| 5,297,400 A | 3/1994 | Benton et al. |
| 5,301,100 A | 4/1994 | Wagner |
| 5,303,846 A | 4/1994 | Shannon |
| 5,335,276 A | 8/1994 | Thompson et al. |
| 5,336,950 A | 8/1994 | Popli et al. |
| 5,339,428 A | 8/1994 | Burmeister et al. |
| 5,343,716 A | 9/1994 | Swanson et al. |
| 5,361,362 A | 11/1994 | Benkeser et al. |
| 5,367,651 A | 11/1994 | Smith et al. |
| 5,367,687 A | 11/1994 | Tarsy et al. |
| 5,368,198 A | 11/1994 | Goulet |
| 5,379,343 A | 1/1995 | Grube et al. |
| 5,381,546 A | 1/1995 | Servi et al. |
| 5,381,550 A | 1/1995 | Jourdenais et al. |
| 5,388,062 A | 2/1995 | Knutson |
| 5,388,212 A | 2/1995 | Grube et al. |
| 5,392,960 A | 2/1995 | Kendt et al. |
| 5,428,754 A | 6/1995 | Baldwin |
| 5,437,395 A | 8/1995 | Bull et al. |
| 5,450,557 A | 9/1995 | Kopp et al. |
| 5,454,406 A | 10/1995 | Rejret et al. |
| 5,465,368 A | 11/1995 | Davidson et al. |
| 5,475,856 A | 12/1995 | Kogge |
| 5,479,055 A | 12/1995 | Eccles |
| 5,490,165 A | 2/1996 | Blakeney, II et al. |
| 5,491,823 A | 2/1996 | Ruttenberg |
| 5,504,891 A | 4/1996 | Motoyama et al. |
| 5,507,009 A | 4/1996 | Grube et al. |
| 5,515,519 A | 5/1996 | Yoshioka et al. |
| 5,517,600 A | 5/1996 | Shimokawa |
| 5,519,694 A | 5/1996 | Brewer et al. |
| 5,522,070 A | 5/1996 | Sumimoto |
| 5,530,964 A | 6/1996 | Alpert et al. |
| 5,534,796 A | 7/1996 | Edwards |
| 5,542,265 A | 8/1996 | Rutland |
| 5,553,755 A | 9/1996 | Bonewald et al. |
| 5,555,417 A | 9/1996 | Odnert et al. |
| 5,560,028 A | 9/1996 | Sachs et al. |
| 5,560,038 A | 9/1996 | Haddock |
| 5,570,587 A | 11/1996 | Kim |
| 5,572,572 A | 11/1996 | Kawan et al. |
| 5,590,353 A | 12/1996 | Sakakibara et al. |
| 5,594,657 A | 1/1997 | Cantone et al. |
| 5,600,810 A | 2/1997 | Ohkami |
| 5,600,844 A | 2/1997 | Shaw et al. |
| 5,602,833 A | 2/1997 | Zehavi |
| 5,603,043 A | 2/1997 | Taylor et al. |
| 5,607,083 A | 3/1997 | Vogel et al. |
| 5,608,643 A | 3/1997 | Wichter et al. |
| 5,611,867 A | 3/1997 | Cooper et al. |
| 5,623,545 A | 4/1997 | Childs et al. |

| | | | | | |
|---|---|---|---|---|---|
| 5,625,669 A | 4/1997 | McGregor et al. | 5,892,950 A | 4/1999 | Rigori et al. |
| 5,626,407 A | 5/1997 | Westcott | 5,892,961 A | 4/1999 | Trimberger |
| 5,630,206 A | 5/1997 | Urban et al. | 5,892,962 A | 4/1999 | Cloutier |
| 5,635,940 A | 6/1997 | Hickman et al. | 5,894,473 A | 4/1999 | Dent |
| 5,646,544 A | 7/1997 | Iadanza | 5,901,884 A | 5/1999 | Goulet et al. |
| 5,646,545 A | 7/1997 | Trimberger et al. | 5,903,886 A | 5/1999 | Heimlich et al. |
| 5,647,512 A | 7/1997 | Assis Mascarenhas de Oliveira et al. | 5,907,285 A | 5/1999 | Toms et al. |
| | | | 5,907,580 A | 5/1999 | Cummings |
| 5,667,110 A | 9/1997 | McCann et al. | 5,910,733 A | 6/1999 | Bertolet et al. |
| 5,684,793 A | 11/1997 | Kiema et al. | 5,912,572 A | 6/1999 | Graf, III |
| 5,684,980 A | 11/1997 | Casselman | 5,913,172 A | 6/1999 | McCabe et al. |
| 5,687,236 A | 11/1997 | Moskowitz et al. | 5,917,852 A | 6/1999 | Butterfield et al. |
| 5,694,613 A | 12/1997 | Suzuki | 5,920,801 A | 7/1999 | Thomas et al. |
| 5,694,794 A | 12/1997 | Jerg et al. | 5,931,918 A | 8/1999 | Row et al. |
| 5,699,328 A | 12/1997 | Ishizaki et al. | 5,933,642 A | 8/1999 | Greenbaum et al. |
| 5,701,398 A | 12/1997 | Glier et al. | 5,940,438 A | 8/1999 | Poon et al. |
| 5,701,482 A | 12/1997 | Harrison et al. | 5,949,415 A | 9/1999 | Lin et al. |
| 5,704,053 A | 12/1997 | Santhanam | 5,950,011 A | 9/1999 | Albrecht et al. |
| 5,706,191 A | 1/1998 | Bassett et al. | 5,950,131 A | 9/1999 | Vilmur |
| 5,706,976 A | 1/1998 | Purkey | 5,951,674 A | 9/1999 | Moreno |
| 5,712,996 A | 1/1998 | Schepers | 5,953,322 A | 9/1999 | Kimball |
| 5,720,002 A | 2/1998 | Wang | 5,956,518 A | 9/1999 | DeHon et al. |
| 5,721,693 A | 2/1998 | Song | 5,956,967 A | 9/1999 | Kim |
| 5,721,854 A | 2/1998 | Ebcioglu et al. | 5,959,811 A | 9/1999 | Richardson |
| 5,729,754 A | 3/1998 | Estes | 5,959,881 A | 9/1999 | Trimberger et al. |
| 5,732,563 A | 3/1998 | Bethuy et al. | 5,963,048 A | 10/1999 | Harrison et al. |
| 5,734,808 A | 3/1998 | Takeda | 5,966,534 A | 10/1999 | Cooke et al. |
| 5,737,631 A | 4/1998 | Trimberger | 5,970,254 A | 10/1999 | Cooke et al. |
| 5,742,180 A | 4/1998 | DeHon et al. | 5,987,105 A | 11/1999 | Jenkins et al. |
| 5,742,821 A | 4/1998 | Prasanna | 5,987,611 A | 11/1999 | Freund |
| 5,745,366 A | 4/1998 | Higham et al. | 5,991,302 A | 11/1999 | Berl et al. |
| RE35,780 E | 5/1998 | Hassell et al. | 5,991,308 A | 11/1999 | Fuhrmann et al. |
| 5,751,295 A | 5/1998 | Becklund et al. | 5,993,739 A | 11/1999 | Lyon |
| 5,754,227 A | 5/1998 | Fukuoka | 5,999,734 A | 12/1999 | Willis et al. |
| 5,758,261 A | 5/1998 | Wiedeman | 6,005,943 A | 12/1999 | Cohen et al. |
| 5,768,561 A | 6/1998 | Wise | 6,006,249 A | 12/1999 | Leong |
| 5,771,362 A | 6/1998 | Bartkowiak et al. | 6,016,395 A | 1/2000 | Mohamed |
| 5,778,439 A | 7/1998 | Trimberger et al. | 6,018,783 A | 1/2000 | Chiang |
| 5,784,636 A | 7/1998 | Rupp | 6,021,186 A | 2/2000 | Suzuki et al. |
| 5,784,699 A | 7/1998 | McMahon et al. | 6,021,492 A | 2/2000 | May |
| 5,787,237 A | 7/1998 | Reilly | 6,023,742 A | 2/2000 | Ebeling et al. |
| 5,790,817 A | 8/1998 | Asghar et al. | 6,023,755 A | 2/2000 | Casselman |
| 5,791,517 A | 8/1998 | Avital | 6,028,610 A | 2/2000 | Deering |
| 5,791,523 A | 8/1998 | Oh | 6,036,166 A | 3/2000 | Olson |
| 5,794,062 A | 8/1998 | Baxter | 6,039,219 A | 3/2000 | Bach et al. |
| 5,794,067 A | 8/1998 | Kadowaki | 6,041,322 A | 3/2000 | Meng et al. |
| 5,802,055 A | 9/1998 | Krein et al. | 6,041,970 A | 3/2000 | Vogel |
| 5,802,278 A | 9/1998 | Isfeld et al. | 6,046,603 A | 4/2000 | New |
| 5,812,851 A | 9/1998 | Levy et al. | 6,047,115 A | 4/2000 | Mohan et al. |
| 5,818,603 A | 10/1998 | Motoyama | 6,052,600 A | 4/2000 | Fette et al. |
| 5,819,255 A | 10/1998 | Celis et al. | 6,055,314 A | 4/2000 | Spies et al. |
| 5,822,308 A | 10/1998 | Weigand et al. | 6,056,194 A | 5/2000 | Kolls |
| 5,822,313 A | 10/1998 | Malek et al. | 6,059,840 A | 5/2000 | Click, Jr. |
| 5,822,360 A | 10/1998 | Lee et al. | 6,061,580 A | 5/2000 | Altschul et al. |
| 5,828,858 A | 10/1998 | Athanas et al. | 6,073,132 A | 6/2000 | Gehman |
| 5,829,085 A | 11/1998 | Jerg et al. | 6,076,174 A | 6/2000 | Freund |
| 5,835,753 A | 11/1998 | Witt | 6,078,736 A | 6/2000 | Guccione |
| 5,838,165 A | 11/1998 | Chatter | 6,085,740 A | 7/2000 | Ivri et al. |
| 5,838,894 A | 11/1998 | Horst | 6,088,043 A | 7/2000 | Kelleher et al. |
| 5,845,815 A | 12/1998 | Vogel | 6,091,263 A | 7/2000 | New et al. |
| 5,854,929 A | 12/1998 | Van Pract et al. | 6,091,765 A | 7/2000 | Pietzold, III et al. |
| 5,860,021 A | 1/1999 | Klingman | 6,094,065 A | 7/2000 | Tavana et al. |
| 5,862,961 A | 1/1999 | Motta et al. | 6,094,726 A | 7/2000 | Gonion et al. |
| 5,870,427 A | 2/1999 | Tiedemann, Jr. et al. | 6,111,893 A | 8/2000 | Volftsun et al. |
| 5,873,045 A | 2/1999 | Lee et al. | 6,111,935 A | 8/2000 | Hughes-Hartogs |
| 5,881,106 A | 3/1999 | Cartier | 6,115,751 A | 9/2000 | Tam et al. |
| 5,884,284 A | 3/1999 | Peters et al. | 6,119,178 A | 9/2000 | Martin et al. |
| 5,886,537 A | 3/1999 | Macias et al. | 6,120,551 A | 9/2000 | Law et al. |
| 5,887,174 A | 3/1999 | Simons et al. | 6,122,670 A | 9/2000 | Bennett et al. |
| 5,889,816 A | 3/1999 | Agrawal et al. | 6,128,307 A | 10/2000 | Brown |
| 5,889,989 A | 3/1999 | Robertazzi et al. | 6,134,605 A | 10/2000 | Hudson et al. |
| 5,890,014 A | 3/1999 | Long | 6,134,629 A | 10/2000 | L'Ecuyer |
| 5,892,900 A | 4/1999 | Ginter et al. | 6,138,693 A | 10/2000 | Matz |

| | | | | | | |
|---|---|---|---|---|---|---|
| 6,141,283 | A | 10/2000 | Bogin et al. | 6,430,624 B1 | 8/2002 | Jamtgaard et al. |
| 6,150,838 | A | 11/2000 | Wittig et al. | 6,433,578 B1 | 8/2002 | Wasson |
| 6,154,492 | A | 11/2000 | Araki et al. | 6,434,590 B1 | 8/2002 | Blelloch et al. |
| 6,154,494 | A | 11/2000 | Sugahara et al. | 6,438,737 B1 | 8/2002 | Morelli et al. |
| 6,157,997 | A | 12/2000 | Oowaki et al. | 6,446,258 B1 | 9/2002 | McKinsey et al. |
| 6,158,031 | A | 12/2000 | Mack et al. | 6,449,747 B2 | 9/2002 | Wuytack et al. |
| 6,173,389 | B1 | 1/2001 | Pechanek et al. | 6,456,996 B1 | 9/2002 | Crawford, Jr. et al. |
| 6,175,854 | B1 | 1/2001 | Bretscher | 6,459,883 B2 | 10/2002 | Subramanian et al. |
| 6,175,892 | B1 | 1/2001 | Sazzad et al. | 6,467,009 B1 | 10/2002 | Winegarden et al. |
| 6,181,981 | B1 | 1/2001 | Varga et al. | 6,469,540 B2 | 10/2002 | Nakaya |
| 6,185,418 | B1 | 2/2001 | MacLellan et al. | 6,473,609 B1 | 10/2002 | Schwartz et al. |
| 6,192,070 | B1 | 2/2001 | Poon et al. | 6,483,343 B1 | 11/2002 | Faith et al. |
| 6,192,255 | B1 | 2/2001 | Lewis et al. | 6,507,947 B1 | 1/2003 | Schreiber et al. |
| 6,192,388 | B1 | 2/2001 | Cajolet | 6,510,138 B1 | 1/2003 | Pannell |
| 6,195,788 | B1 | 2/2001 | Leaver et al. | 6,510,510 B1 | 1/2003 | Garde |
| 6,198,924 | B1 | 3/2001 | Ishii et al. | 6,526,570 B1 | 2/2003 | Click, Jr. et al. |
| 6,199,181 | B1 | 3/2001 | Rechef et al. | 6,538,470 B1 | 3/2003 | Langhammer et al. |
| 6,202,130 | B1 | 3/2001 | Scales, III et al. | 6,556,044 B2 | 4/2003 | Langhammer et al. |
| 6,202,189 | B1 | 3/2001 | Hinedi et al. | 6,563,891 B1 | 5/2003 | Eriksson et al. |
| 6,216,252 | B1 * | 4/2001 | Dangelo et al. ............... 716/1 | 6,570,877 B1 | 5/2003 | Kloth et al. |
| 6,219,697 | B1 | 4/2001 | Lawande et al. | 6,577,678 B2 | 6/2003 | Scheuermann |
| 6,219,756 | B1 | 4/2001 | Kasamizugami | 6,587,684 B1 | 7/2003 | Hsu et al. |
| 6,219,780 | B1 | 4/2001 | Lipasti | 6,590,415 B2 | 7/2003 | Agrawal et al. |
| 6,223,222 | B1 | 4/2001 | Fijolek et al. | 6,601,086 B1 | 7/2003 | Howard et al. |
| 6,226,387 | B1 | 5/2001 | Tewfik et al. | 6,601,158 B1 | 7/2003 | Abbott et al. |
| 6,230,307 | B1 | 5/2001 | Davis et al. | 6,604,085 B1 | 8/2003 | Kolls |
| 6,237,029 | B1 | 5/2001 | Master et al. | 6,604,189 B1 | 8/2003 | Zemlyak et al. |
| 6,246,883 | B1 | 6/2001 | Lee | 6,606,529 B1 | 8/2003 | Crowder, Jr. et al. |
| 6,247,125 | B1 | 6/2001 | Noel-Baron et al. | 6,611,906 B1 | 8/2003 | McAllister et al. |
| 6,249,251 | B1 | 6/2001 | Chang et al. | 6,615,333 B1 | 9/2003 | Hoogerbrugge et al. |
| 6,258,725 | B1 | 7/2001 | Lee et al. | 6,618,434 B2 | 9/2003 | Heidari-Bateni et al. |
| 6,263,057 | B1 | 7/2001 | Silverman | 6,618,777 B1 | 9/2003 | Greenfield |
| 6,266,760 | B1 | 7/2001 | DeHon et al. | 6,640,304 B2 | 10/2003 | Ginter et al. |
| 6,272,579 | B1 | 8/2001 | Lentz et al. | 6,647,429 B1 | 11/2003 | Semal |
| 6,272,616 | B1 | 8/2001 | Fernando et al. | 6,653,859 B2 | 11/2003 | Sihlbom et al. |
| 6,281,703 | B1 | 8/2001 | Furuta et al. | 6,675,265 B2 | 1/2004 | Barroso et al. |
| 6,282,627 | B1 | 8/2001 | Wong et al. | 6,675,284 B1 | 1/2004 | Warren |
| 6,286,134 | B1 | 9/2001 | Click, Jr. et al. | 6,684,319 B1 | 1/2004 | Mohamed et al. |
| 6,289,375 | B1 | 9/2001 | Knight et al. | 6,691,148 B1 | 2/2004 | Zinky et al. |
| 6,289,434 | B1 | 9/2001 | Roy | 6,694,380 B1 | 2/2004 | Wolrich et al. |
| 6,289,488 | B1 | 9/2001 | Dave et al. | 6,711,617 B1 | 3/2004 | Bantz et al. |
| 6,292,822 | B1 | 9/2001 | Hardwick | 6,718,182 B1 | 4/2004 | Kung |
| 6,292,827 | B1 | 9/2001 | Raz | 6,718,541 B2 | 4/2004 | Ostanevich et al. |
| 6,292,830 | B1 | 9/2001 | Taylor et al. | 6,721,286 B1 | 4/2004 | Williams et al. |
| 6,292,938 | B1 | 9/2001 | Sarkar et al. | 6,721,884 B1 | 4/2004 | De Oliveira Kastrup Pereira et al. |
| 6,301,653 | B1 | 10/2001 | Mohamed et al. | 6,732,354 B2 | 5/2004 | Ebeling et al. |
| 6,305,014 | B1 | 10/2001 | Roediger et al. | 6,735,621 B1 | 5/2004 | Yoakum et al. |
| 6,311,149 | B1 | 10/2001 | Ryan et al. | 6,738,744 B2 | 5/2004 | Kirovski et al. |
| 6,321,985 | B1 | 11/2001 | Kolls | 6,748,360 B2 | 6/2004 | Pitman et al. |
| 6,326,806 | B1 | 12/2001 | Fallside et al. | 6,751,723 B1 | 6/2004 | Kundu et al. |
| 6,346,824 | B1 | 2/2002 | New | 6,754,470 B2 | 6/2004 | Hendrickson et al. |
| 6,347,346 | B1 | 2/2002 | Taylor | 6,760,587 B2 | 7/2004 | Holtzman et al. |
| 6,349,394 | B1 | 2/2002 | Brock et al. | 6,760,833 B1 | 7/2004 | Dowling |
| 6,353,841 | B1 | 3/2002 | Marshall et al. | 6,766,165 B2 | 7/2004 | Sharma et al. |
| 6,356,994 | B1 | 3/2002 | Barry et al. | 6,778,212 B1 | 8/2004 | Deng et al. |
| 6,359,248 | B1 | 3/2002 | Mardi | 6,785,341 B2 | 8/2004 | Walton et al. |
| 6,360,256 | B1 | 3/2002 | Lim | 6,807,590 B1 | 10/2004 | Carlson et al. |
| 6,360,259 | B1 | 3/2002 | Bradley | 6,819,140 B2 | 11/2004 | Yamanaka et al. |
| 6,360,263 | B1 | 3/2002 | Kurtzberg et al. | 6,823,448 B2 | 11/2004 | Roth et al. |
| 6,363,411 | B1 | 3/2002 | Dugan et al. | 6,829,633 B2 | 12/2004 | Gelfer et al. |
| 6,366,999 | B1 | 4/2002 | Drabenstott et al. | 6,832,250 B1 | 12/2004 | Coons et al. |
| 6,377,983 | B1 | 4/2002 | Cohen et al. | 6,836,839 B2 | 12/2004 | Master et al. |
| 6,378,072 | B1 | 4/2002 | Collins et al. | 6,859,434 B2 | 2/2005 | Segal et al. |
| 6,381,293 | B1 | 4/2002 | Lee et al. | 6,865,664 B2 | 3/2005 | Budrovic et al. |
| 6,381,735 | B1 | 4/2002 | Hunt | 6,871,236 B2 | 3/2005 | Fishman et al. |
| 6,385,751 | B1 | 5/2002 | Wolf | 6,883,074 B2 | 4/2005 | Lee et al. |
| 6,405,214 | B1 | 6/2002 | Meade, II | 6,883,084 B1 | 4/2005 | Donohoe |
| 6,408,039 | B1 | 6/2002 | Ito | 6,894,996 B2 | 5/2005 | Lee |
| 6,410,941 | B1 | 6/2002 | Taylor et al. | 6,901,440 B1 | 5/2005 | Bimm et al. |
| 6,411,612 | B1 | 6/2002 | Halford et al. | 6,907,598 B2 | 6/2005 | Fraser |
| 6,421,372 | B1 | 7/2002 | Bierly et al. | 6,912,515 B2 | 6/2005 | Jackson et al. |
| 6,421,809 | B1 | 7/2002 | Wuytack et al. | 6,941,336 B1 | 9/2005 | Mar |
| 6,426,649 | B1 | 7/2002 | Fu et al. | 6,980,515 B1 | 12/2005 | Schunk et al. |

| | | |
|---|---|---|
| 6,985,517 B2 | 1/2006 | Matsumoto et al. |
| 6,986,021 B2 | 1/2006 | Master et al. |
| 6,986,142 B1 | 1/2006 | Ehlig et al. |
| 6,988,139 B1 | 1/2006 | Jervis et al. |
| 7,032,229 B1 | 4/2006 | Flores et al. |
| 7,044,741 B2 | 5/2006 | Leem |
| 7,082,456 B2 | 7/2006 | Mani-Meitav et al. |
| 7,124,064 B1 * | 10/2006 | Thurston ............... 703/2 |
| 7,139,910 B1 | 11/2006 | Ainsworth et al. |
| 7,142,731 B1 | 11/2006 | Toi |
| 7,249,242 B2 | 7/2007 | Ramchandran |
| 2001/0003191 A1 | 6/2001 | Kovacs et al. |
| 2001/0023482 A1 | 9/2001 | Wray |
| 2001/0029515 A1 | 10/2001 | Mirsky |
| 2001/0034795 A1 | 10/2001 | Moulton et al. |
| 2001/0039654 A1 | 11/2001 | Miyamoto |
| 2001/0048713 A1 | 12/2001 | Medlock et al. |
| 2001/0048714 A1 | 12/2001 | Jha |
| 2001/0050948 A1 | 12/2001 | Ramberg et al. |
| 2002/0010848 A1 | 1/2002 | Kamano et al. |
| 2002/0013799 A1 | 1/2002 | Blaker |
| 2002/0013937 A1 | 1/2002 | Ostanevich et al. |
| 2002/0015435 A1 | 2/2002 | Rieken |
| 2002/0015439 A1 | 2/2002 | Kohli et al. |
| 2002/0023210 A1 | 2/2002 | Tuomenoksa et al. |
| 2002/0024942 A1 | 2/2002 | Tsuneki et al. |
| 2002/0024993 A1 | 2/2002 | Subramanian et al. |
| 2002/0031166 A1 | 3/2002 | Subramanian et al. |
| 2002/0032551 A1 | 3/2002 | Zakiya |
| 2002/0035623 A1 | 3/2002 | Lawande et al. |
| 2002/0041581 A1 | 4/2002 | Aramaki |
| 2002/0042875 A1 | 4/2002 | Shukla |
| 2002/0042907 A1 | 4/2002 | Yamanaka et al. |
| 2002/0061741 A1 | 5/2002 | Leung et al. |
| 2002/0069282 A1 | 6/2002 | Reisman |
| 2002/0072830 A1 | 6/2002 | Hunt |
| 2002/0078337 A1 | 6/2002 | Moreau et al. |
| 2002/0083305 A1 | 6/2002 | Renard et al. |
| 2002/0083423 A1 | 6/2002 | Ostanevich et al. |
| 2002/0087829 A1 | 7/2002 | Snyder et al. |
| 2002/0089348 A1 | 7/2002 | Langhammer |
| 2002/0101909 A1 | 8/2002 | Chen et al. |
| 2002/0107905 A1 | 8/2002 | Roe et al. |
| 2002/0107962 A1 | 8/2002 | Richter et al. |
| 2002/0119803 A1 | 8/2002 | Bitterlich et al. |
| 2002/0120672 A1 | 8/2002 | Butt et al. |
| 2002/0133688 A1 | 9/2002 | Lee et al. |
| 2002/0138716 A1 | 9/2002 | Master et al. |
| 2002/0141489 A1 | 10/2002 | Imaizumi |
| 2002/0147845 A1 | 10/2002 | Sanchez-Herrero et al. |
| 2002/0159503 A1 | 10/2002 | Ramachandran |
| 2002/0162026 A1 | 10/2002 | Neuman et al. |
| 2002/0168018 A1 | 11/2002 | Scheuermann |
| 2002/0181559 A1 | 12/2002 | Heidari-Bateni et al. |
| 2002/0184275 A1 | 12/2002 | Dutta et al. |
| 2002/0184291 A1 | 12/2002 | Hogenauer |
| 2002/0184498 A1 | 12/2002 | Qi |
| 2002/0191790 A1 | 12/2002 | Anand et al. |
| 2003/0007606 A1 | 1/2003 | Suder et al. |
| 2003/0012270 A1 | 1/2003 | Zhou et al. |
| 2003/0018446 A1 | 1/2003 | Makowski et al. |
| 2003/0018700 A1 | 1/2003 | Giroti et al. |
| 2003/0023830 A1 | 1/2003 | Hogenauer |
| 2003/0026242 A1 | 2/2003 | Jokinen et al. |
| 2003/0030004 A1 | 2/2003 | Dixon et al. |
| 2003/0046421 A1 | 3/2003 | Horvitz et al. |
| 2003/0061260 A1 | 3/2003 | Rajkumar |
| 2003/0061311 A1 | 3/2003 | Lo |
| 2003/0063656 A1 | 4/2003 | Rao et al. |
| 2003/0074473 A1 | 4/2003 | Pham et al. |
| 2003/0076815 A1 | 4/2003 | Miller et al. |
| 2003/0099223 A1 | 5/2003 | Chang et al. |
| 2003/0102889 A1 | 6/2003 | Master et al. |
| 2003/0105949 A1 | 6/2003 | Master et al. |
| 2003/0110485 A1 | 6/2003 | Lu et al. |
| 2003/0131162 A1 | 7/2003 | Secatch et al. |
| 2003/0142818 A1 | 7/2003 | Raghunathan et al. |
| 2003/0154357 A1 | 8/2003 | Master et al. |
| 2003/0163723 A1 | 8/2003 | Kozuch et al. |
| 2003/0172138 A1 | 9/2003 | McCormack et al. |
| 2003/0172139 A1 | 9/2003 | Srinivasan et al. |
| 2003/0200538 A1 | 10/2003 | Ebeling et al. |
| 2003/0212684 A1 | 11/2003 | Meyer et al. |
| 2003/0229864 A1 | 12/2003 | Watkins |
| 2004/0006584 A1 | 1/2004 | Vandeweerd |
| 2004/0010645 A1 | 1/2004 | Scheuermann et al. |
| 2004/0015970 A1 | 1/2004 | Scheuermann |
| 2004/0025159 A1 | 2/2004 | Scheuermann et al. |
| 2004/0057505 A1 | 3/2004 | Valio |
| 2004/0062300 A1 | 4/2004 | McDonough et al. |
| 2004/0081248 A1 | 4/2004 | Parolari |
| 2004/0093479 A1 | 5/2004 | Ramchandran |
| 2004/0133745 A1 | 7/2004 | Ramchandran |
| 2004/0168044 A1 | 8/2004 | Ramchandran |
| 2005/0044344 A1 | 2/2005 | Stevens |
| 2005/0166038 A1 | 7/2005 | Wang et al. |
| 2005/0166073 A1 | 7/2005 | Lee |
| 2005/0198199 A1 | 9/2005 | Dowling |
| 2006/0031660 A1 | 2/2006 | Master et al. |

FOREIGN PATENT DOCUMENTS

| | | |
|---|---|---|
| EP | 1 189 358 A1 | 7/1981 |
| EP | 0 301 169 A1 | 2/1989 |
| EP | 0 166 586 B1 | 1/1991 |
| EP | 0 236 633 B1 | 5/1991 |
| EP | 0 478 624 B1 | 4/1992 |
| EP | 0 479 102 A2 | 4/1992 |
| EP | 0 661 831 A2 | 7/1995 |
| EP | 0 668 659 A2 | 8/1995 |
| EP | 0 690 588 A2 | 1/1996 |
| EP | 0 691 754 A2 | 1/1996 |
| EP | 0 768 602 A2 | 4/1997 |
| EP | 0 817 003 A2 | 1/1998 |
| EP | 0 821 495 A2 | 1/1998 |
| EP | 0 866 210 A2 | 9/1998 |
| EP | 0 923 247 A2 | 6/1999 |
| EP | 0 926 596 A2 | 6/1999 |
| EP | 1 056 217 A2 | 11/2000 |
| EP | 1 061 437 A1 | 12/2000 |
| EP | 1 061 443 A2 | 12/2000 |
| EP | 1 126 368 A2 | 8/2001 |
| EP | 1 150 506 A2 | 10/2001 |
| GB | 2 067 800 A | 7/1981 |
| GB | 2 237 908 A | 5/1991 |
| JP | 62-249456 | 10/1987 |
| JP | 63-147258 | 6/1988 |
| JP | 4-51546 | 2/1992 |
| JP | 7-064789 | 3/1995 |
| JP | 7066718 | 3/1995 |
| JP | 10233676 | 9/1998 |
| JP | 10254696 | 9/1998 |
| JP | 11296345 | 10/1999 |
| JP | 2000315731 | 11/2000 |
| JP | 2001-053703 | 2/2001 |
| WO | WO 89/05029 A1 | 6/1989 |
| WO | WO 89/11443 A2 | 11/1989 |
| WO | WO 91/00238 A1 | 1/1991 |
| WO | WO 93/13603 A1 | 7/1993 |
| WO | WO 95/11855 A1 | 5/1995 |
| WO | WO 96/33558 A1 | 10/1996 |
| WO | WO 98/32071 A3 | 7/1998 |
| WO | WO 99/03776 A1 | 1/1999 |
| WO | WO 99/21094 A2 | 4/1999 |
| WO | WO 99/26860 A1 | 6/1999 |
| WO | WO 99/65818 A1 | 12/1999 |

| | | | |
|---|---|---|---|
| WO | WO 00/19311 A1 | 4/2000 | |
| WO | WO 00/65855 A1 | 11/2000 | |
| WO | WO 00/69073 A1 | 11/2000 | |
| WO | WO 01/11281 A1 | 2/2001 | |
| WO | WO 01/22235 A1 | 3/2001 | |
| WO | WO 01/76129 A2 | 10/2001 | |
| WO | WO 02/12978 A2 | 2/2002 | |

OTHER PUBLICATIONS

Altera Apex 20K 1999.
Andraka Consulting Group, "Distributed Arithmetic," Obtained from: http://www.fpga-guru.com/distribu.htm (1998-2000).
Bickerstaff et al., "A Unified Turbo/Viterbi Channel Decoder for 3GPP Mobile Wireless in 0.18μ CMOS," IEEE *Journal of Solid-State Circuits* 37(11):1555-62 (2002).
Bogdan et al., "Power Reduction Techniques for a Viterbi Decoder Implementation,".
Chang et al., "Low-Power Bit-Serial Viterbi Decoder for Next Generation Wide-Band CDMA Systems,".
Clark et al., "Error Correction Coding for Digital Communications," Plenum Press NY (1981).
Computer Organization and Design 2$^{nd}$ Edition, Hennessy, Morgan Kaufmann Publishers, pp. 569-570 (1998).
Free On-Line Dictionary of Computing. © 1995-2000 www.foldoc.org search terms: cache, operating system, Internet, DMA, interrupt.
Garrett et al, "Low Power Architecture of the Soft-Output Viterbi Algorithm,".
Hanna et al., "A Normalized Backpropagation Learning Algorithm for Multilayer Feed-Forward Neural Adaptive Filters," *Neural Networks for Signal Processing XI*, Proceedings of the 2001 IEEE Signal Processing Society Workshop pp. 63-72 (Sep. 2001).
Hekstra, "An Alternative to Metric Resealing in Viterbi Decoders," IEEE Transactions on Communications vol. 37 No. 11 (Nov. 1989).
Hendrix, "Viterbi Decoding Techniques in the TMS320C54x Family," Texas Instruments Application Note (Jun. 1996).
Janweijer et al., "A Compact Robin Using the SHarc (CRUSH)," Obtained from: http://www.nikhef.nl/~peterj/Crush/CRUSH-hw.pdf (Sep. 1998).
Kim et al, "Implementation of Convolutional Encoder and Viterbi Decoder for Wideband CDMA PCS Baseband Processing Unit Using Multiple TMS320C40s,".
Matache et al., "Trellis Coding for Diagonally Layered Space-Time Systems,".
Paaske et al., "High Speed Viterbi Decoder Architecture," First ESA Workshop on Tracking, Telemetry and Command Systems, ESTEC (Jun. 1998).
Rajagopalan et al., "A Flexible Multiplication Unit for an FPGA Logic Block," *Circuits and Systems* 4:546-9 (2001).
Xilinx Data Book 1998.
Xilinx Virtex 1.1 1998.
Xilinx Virtex 2.2 2000.
Yeo et al., "Implementation of High Throughput Soft Output Viterbi Decoders," Proc. IEEE Workshop on Signal Processing Systems pp. 146-151 San Diego CA (Oct. 2002).
Abnous et al., "Ultra-Low-Power Domain-Specific Multimedia Processors," VLSI Signal Processing, IX, 1998, IEEE Workshop in San Francisco, CA, USA, Oct. 30-Nov. 1, 1998, pp. 461-470 (Oct. 30, 1998).
Aggarwal et al.., "Efficient Huffman Decoding," International Conference on Image Processing IEEE 1:936-939 (Sep. 10-13, 2000).
Allan et al., "Software Pipelining," ACM Computing Surveys, 27(3):1-78 (Sep. 1995).
Alsolaim et al., "Architecture and Application of a Dynamically Reconfigurable Hardware Array for Future Mobile Communication Systems," Field Programmable Custom Computing Machines, 2000 IEEE Symposium, Napa Valley, Los Alamitos, CA. IEEE Comput. Soc. pp. 205-214 (Apr. 17-19, 2000).
Ashenden et al., "The VHDL Cookbook," Dept. Computer Science, University of Adelaide, South Australia. Downloaded from http://tams-www.informatik.uni-hamburg.de/vhdl/doc/cookbook/VHDL-Cookbook.pdf on Dec. 7, 2006 (Jul. 1990).

Bacon et al., "Compiler Transformations for High-Performance Computing," ACM Computing Surveys 26(4):368-373 (Dec. 1994).
Balasubramonian et al., "Reducing the Complexity of the Register File in Dynamic Superscalar Processors," Proceedings of the 34th Annual ACM/IEEE International Symposium on Microarchitecture, pp. 237-248 (Dec. 1, 2001).
Banerjee et al., "A MATLAB Compiler for Distributed, Heterogeneous, Reconfigurable Computing Systems," 2000 IEEE Symposium, pp. 39-48, (Apr. 17-19, 2000).
Bapte et al., "Uniform Execution Environment for Dynamic Reconfiguration," Darpa Adaptive Computing Systems, http://isis.vanderbilt.edu/publications/archive/babty_T_#_0_1999_Uniform_Ex.pdf, pp. 1-7 (1999).
Baumgarte et al., "PACT XPP—A Self-Reconfigurable Data Processing Architecture," NN www.pactcorp.com/sneu/download/ersa01.pdfi retrieved on Nov. 25, 2005 (Jun. 25, 2001).
Becker et al., "An Application-Tailored Dynamically Reconfigurable Hardware Architecture for Digital Baseband Processing," IEEE Conference Proceedings Article pp. 341-346 (Sep. 18, 2000).
Becker et al., "Design and Implementation of a Coarse-Grained Dynamically Reconfigurable Hardware Architecture," VLSI 2001, Proceedings IEEE Computer Soc. Workshop, Piscataway, NJ, USA, pp. 41-46 (Apr. 19-20, 2001).
Bevstar, BevStar Bottled Water Model Advertisement *Automatic Merchandiser* at www.AMonline.com (2005).
Bevstar, BevStar Point of Use Water Model Advertisement *Automatic Merchandiser* at www.AMonline.com (2005).
Bishop & Loucks, "A Heterogeneous Environment for Hardware/Software Cosimulation," Proceedings of the 30th Annual Simulation Symposium, pp. 14-22 (Apr. 7-9, 1997).
Brakensiek et al., "Re-Configurable Multi-Standard Terminal for Heterogeneous Networks," Radio and Wireless Conference, Rawcon 2002 IEEE. pp. 27-30 (2002).
Brown et al., "Quick PDA Data Exchange," PC Magazine pp. 1-3 (May 22, 2001).
Buck et al., "Ptolemy: A Framework for Simulating and Prototyping Heterogeneous Systems," International Journal of Computer Simulation 4:155-182 (Apr. 1994).
Burns et al., "A Dynamic Reconfiguration Run-Time System," Proceedings of the 5th Annual Symposium on Field-Programmable Custom Computing Machines, pp. 166-175 (Apr. 16, 1997).
Business Wire, "Whirlpool Internet-Enabled Appliances to Use Beeline Shopper Software Features," http://www.whirlpoocorp.com/news/releases/release.asp?rid=90 (Feb. 16, 2001).
Buttazzo et al., "Optimal Deadline Assignment for Scheduling Soft Aperiodic Tasks in Hard Real-Time Environments," Engineering of Complex Computer Systems, Proceedings of the Third IEEE International Conference on Como, pp. 39-48 (Sep. 8, 1997).
Callahan et al., "Adapting Software Pipelining for Reconfigurable Computing," in Proceedings of the International Conference on Compilers, Architectrue and Synthesis for Embedded Systems p. 8, ACM (CASES '00, San Jose, CA) (Nov. 17-18, 2000).
Chapman & Mehrotra, "OpenMP and HPF: Integrating Two Paradigms," Proceedings of the 4th International Euro-Par Conference (Euro-Par'98), Springer-Verlag Heidelberg, Lecture Notes in Computer Science 1470:650-658 (1998).
Chen et al., "A Reconfigurable Multiprocessor IC for Rapid Prototyping of Algorithmic-Specific High-Speed DSP Data Paths," IEEE Journal of Solid-State Circuits, IEEE 35:74-75 (Feb. 1, 2001).
Clarke, "Embedded Solutions Enters Development Pact with Marconi," EETimes Online (Jan. 26, 2000).
Compton & Hauck, "Reconfigurable Computing: A Survey of Systems and Software," ACM Press, ACM Computing Surveys (CSUR) 34(2):171-210 (Jun. 2002).
Compton et al., "Configuration Relocation and Defragmentation for Run-Time Reconfigurable Computing," Northwestern University, http://citeseer.nj.nec.com/compton00configuration.html, pp. 1-17 (2000).
Conte et al., "Dynamic Rescheduling: A Technique for Object Code Compatibility in VLIW Architectures," Proceedings of the 28th Annual International Symposium on Microarchitecture pp. 208-218 (Nov. 29, 1995).

Conte et al., "Instruction Fetch Mechanisms for VLIW Architectures with Compressed Encodings," Proceedings of the Annual IEEE/ACM International Symposium on Microarchitecture (MICRO) 29:201-211 (Dec. 2, 1996).

Cray Research Inc., "Cray T3E Fortran Optimization Guide," Ver. 004-2518-002, Section 4.5 (Jan. 1999).

Cummings et al., "FPGA in the Software Radio," IEEE Communications Magazine . 37(2):108-112 (Feb. 1999).

Dandalis et al., "An Adaptive Cryptograhic Engine for IPSec Architectures," IEEE pp. 132-141 (Jan. 2000).

David et al., "DART: A Dynamically Reconfigurable Architecture Dealing with Future Mobile Telecommunication Constraints," Proceedings of the International Parallel and Distributed Processing Symposium pp. 156-163 (Apr. 15, 2002).

Deepakumara et al., "FPGA Implementation of MD5 has Algorithm," Canadian Conference on Electrical and Computer Engineering, IEEE (2001).

Dehon et al., "Reconfigurable Computing: What, Why and Implications for Design Automation," Design Automation Conference Proceedings pp. 610-615 (1999).

Dipert, "Figuring Out Reconfigurable Logic," EDN 44(16):107-114 (Aug. 5, 1999).

Dominikus, "A Hardware Implementation of MD4-Family Hash Algorithms," 9th International Conference on Electronics, Circuits and Systems IEEE (2002).

Dorband, "aCe C Language Reference Guide," Online (Archived Mar. 2001), http://web.archive.org/web/20000616053819/http://newton.gsfc.nasa.gov/aCe/aCe_dir/aCe_cc_Ref.html (Mar. 2001).

Drozdowski, "Scheduling Multiprocessor Tasks—An Overview," Instytut Informatyki Politechnika, pp. 1-31 (Jan. 31, 1996).

Ebeling et al., "RaPiD Reconfigurable Pipelined Datapath," Springer-Verlag, 6th International Workshop on Field-Programmable Logic and Applications pp. 126-135 (1996).

Fawer et al., "A Multiprocessor Approach for Implementing a Time-Diversity Spread Specturm Receiver," Proceeding sof the 1990 International Zurich Seminal on Digital Communications, pp. 173-180 (Mar. 5-8, 1990).

Fisher, "Gone Flat," Forbes pp. 76-79 (Oct. 2001).

Fleischiviann et al., "Prototyping Networked Embedded Systems," Integrated Engineering, pp. 116-119 (Feb. 1999).

Forbes "Best of the Web—Computer Networking/Consumer Durables," *The Forbes Magnetic* 40 p. 80 (May 2001).

Gibson, "Fresh Technologies Will Create Myriad Functions," FT Information Technology Review; World Wide Web at http://technews.acm.org/articles/2000-2/0301w.html?searchterm=%22fresh+technologies%22 (Mar. 1, 2000).

Gluth, "Integrierte Signalprozessoren," Elektronik 35(18):112-118 Franzis Verlag GMBH, Munich, Germany (Sep. 5, 1986).

Gokhale & Schlesinger, "A Data Parallel C and Its Platforms," Proceedings of the Fifth Symposium on the Frontiers of Massively Parallel Computation pp. 194-202 (Frontiers '95) (Feb. 1995).

Grimm et al., "A System Architecture for Pervasive Computing," Washington University, pp. 1-6 (Sep. 2000).

Halbwachs et al., "The Synchronous Data Flow Programming Language LUSTRE," Proceedings of the IEEE 79(9):1305-1319 (Sep. 1991).

Hammes et al., "Cameron: High Level Language Compilation for Reconfigurable Systems," Proc. of the Intl. Conf. on Parallel Architectures and Compilation Techniques, pp. 236-244 (Oct. 1999).

Hartenstein, "Coarse Grain Reconfigurable Architectures," Design Automation Conference, 2001. Proceedings of the ASP-Dac 2001, Asian and South Pacific Jan. 30, 2001- Februray 2, 2001, Piscataway, Nj, US, IEEE, pp. 564-569 (Jan. 30, 2001).

Heinz, "An Efficiently Compilable Extension of {M}odula-3 for Problem-Oriented Explicitly Parallel Programming," Proceedings of the Joint Symposium on Parallel Processing (May 1993).

Hinden et al., "The DARPA Internet: Interconnecting Heterogeneous Computer Networks with Gateways," IEEE Computer Magazine pp. 38-48 (1983).

Horton, "Beginning Java 2: JDK 1.3 Edition," Wrox Press, Chapter 8, pp. 313-316 (Feb. 2001).

Huff et al., "Lifetime-Sensitive Modulo Scheduling," 6th Conference on Programming Language, Design and Implementation, pp. 258-267, ACM (1993).

IBM, "Multisequencing a Single Instruction Stream Scheduling with Space-time Trade-offs," IBM Technical Disclosure Bulletin 36(2):105-108 (Feb. 1, 1993).

IEEE, "IEEE Standard Verilog Hardware Description Language," downloaded from http://inst.eecs.berkeley.edu/~cs150/fa06/Labs/verilog-ieee.pdf on Dec. 7, 2006 (Sep. 2001).

Internet Wire, Sunbeam Joins Microsoft in University Plug and Play Forum to Establish A "Universal" Smart Appliance Technology Standard (Mar. 23, 2000).

Ishii et al., "Parallel Variable Length Decoding with Inverse Quantization for Software MPEG-2 Decoders," Workshop on Signal Processing Systems, Design and Implementation, IEEE pp. 500-509 (Nov. 3-5, 1997).

Isoworth, "Isoworth Beverage Dispensing Technology Worldwide Company," Brochure (May 22, 2000).

Jain et al., "An Alternative Approach Towards the Design of Control Units," Microelectronics and Reliability 24(6):1009-1012 (1984).

Jain, "Parallel Processing with the TMS320C40 Parallel Digital Signal Processor," Sonitech International Inc., pp. 13-46. Retrieved from: http://www-s.ti.com/sc/psheets/spra031/spra031.pdf retrieved on Apr. 14, 2004 (Feb. 1994).

Janssen et al., "Partitioned Register File for TTAs," Proceedings of the 28th Annual International Symposium on Microarchitecture, pp. 303-312 (Nov. 1995).

Jong-Pyng et al., "Real-Time Virtual Channel Flow Control," Proceedings of the Annual International Phoenix Conference on Computers and Communications, Conf. 13, pp. 97-103 (Apr. 12, 1994).

Jung et al., "Efficient Hardware Controller Synthesis for Synchronous Dataflow Graph in System Level Design," Proceedings of the 13th International Symposium on System Synthesis pp. 79-84 (ISSS'00) (Sep. 2000).

Kaufmann ct al., "Digital Spread-Spectrum Multipath-Diversity Receiver for Indoor Communication," from Pioneers to the 21st Century; Denver, Proceedings of the Vehicular Technology Socity [sic] Conference, NY, IEEE, US 2(Conf. 42):1038-1041 (May 10-13, 1992).

Kneip et al., "An Algorithm Adapted Autonomous Controlling Concept for a Parallel Single-Chip Digital Signal Processor," Journal of VLSI Signal Processing Systems for Signal, Image, an dVideo Technology 16(1):31-40 (May 1, 1997).

Lee & Messerschmitt, "Pipeline Interleaved Programmable DSP's: Synchronous Data Flow Programming," IEEE Transactions on Acoustics, Speech, and Signal Processing ASSP-35(9):1334-1345 (Sep. 1987).

Lee & Messerschmitt, "Synchronous Data Flow," Proceedings of the IEEE 75(9):1235-1245 (Sep. 1987).

Lee & Parks, "Dataflow Process Networks," Proceedings of the IEEE 83(5):773-799 (May 1995).

Liu et al., "Scheduling Algorithms for Multiprogramming in a Hard-Real-Time Environment," *Journal of the Association for Computing* 20(1):46-61 (1973).

Llosa et al., "Lifetime-Sensitive Modulo Scheduling in a Production Environment," IEEE Trans. on Comps. 50(3):234-249 (Mar. 2001).

Lu et al., "The Morphosys Dynamically Reconfigurable System-On-Chip," Proceedings of the First NASA/DOD Workshop on Evolvable Hardware, pp. 152-160 (Jul. 19, 1999).

Mangione-Smith et al., "Seeking Solutions in Configurable Computing," *Computer* 30(12):38-43 (Dec. 1997).

Manion, "Network CPU Adds Spice," Electronic Engineering Times, Issue 1126 (Aug. 14, 2000).

Mascia & Ishii., "Neural Net Implementation on Single-Chip Digital Signal Processor," IEEE (1989).

McGraw, "Parallel Functional Programming in Sisal: Fictions, Facts, and Future," Lawrence Livermore National Laboratory pp. 1-40 (Jul. 1993).

Najjar et al., "High-Level Language Abstraction for Reconfigurable Computing," *Computer* 36(8):63-69 (Aug. 2003).

Nichols et al., "Data Management and Control-Flow Constructs in a SIMID/SPMD Parallel Language/Compiler," Proceedings of the 3rd Symposium on the Frontiers of Massively Parallel Computation pp. 397-406 (Oct. 1990).

OpenMP Architecture Review Board, "OpenMP C and C++ Application Program Interface," pp. 7-16 (Oct. 1998).

Oracle Corporation, "Oracle8i JDBC Developer's Guide and Reference," Release 3, 8.1.7, pp. 10-8-10-10 (Jul. 2000).

Pauer et al., "Algorithm Analysis and Mapping Environment for Adaptive Computing Systems: Further Results," Proc. IEEE Symposium on FPGA's for Custom Computing Machines (FCCM), Napa CA (1999).

Pauer et al., "Algorithm Analysis and Mapping Environment for Adaptive Computing Systems," Presentation slides, Third Bi-annual Ptolemy Miniconference (1999).

Ramamritham et al., "On Scheduling Algorithms for Real-Time Multiprocessor Systems," Algorithms and Applications, Proceedings of the International conference on Parallel Processing 3:143-152 (Aug. 8, 1989).

Schneider, "A Parallel/Serial Trade-Off Methodology for Look-Up Table Based Decoders," Proceedings of the Design Automation Conference 34:498-503 (Jun. 9-13, 1997).

Sidhu et al., "A Self-Reconfigurable Gate Array Architecture," 10 International Workshop on Field Programmable Logic and Applications http://coblitz.codeen.org:3125/citeseer.ist.psu.edu/cache/papers/cs/17524/http:zSzzSzmaarcii.usc.eduzSzPublicationsZSzsidhu_fp100.pdf/sidhu00selfreconfigurable.pdf retrieved on Jun. 21, 2006 (Sep. 1, 2001).

Smith, "Intro to ASICs: ASIC Cell Libraries," at http://iroi.seu.edu.cn/books/asics/Book2/CH01/CH01.5.htm, printed on Feb. 4, 2005 (Jun. 1997).

Souza, "Computing's New Face—Reconfigurable Devices Could Rattle Supply Chain," Electronic Buyers' News Issue 1205, p. P.1 (Apr. 3, 2000).

Souza, "Quicksilver Buys White Eagle," Electronic Buyers News, Issue 1220 (Jul. 17, 2000).

Sriram et al., "MPEG-2 Video Decoding on the TMS32OC6X DSP Architecture," Conference Record of the 32nd Asilomar Conference on Signals, Systems, and Computers, IEEE pp. 1735-1739 (Nov. 1-4, 1998).

Steiner, "Coke Chief's Latest Daft Idea—A Cola Tap in Every House," Sunday Times (Mar. 2001).

Sun Microsystems, "FORTRAN 3.0.1 User's Guide, Revision A," pp. 57-68 (Aug. 1994).

Svensson, "Co's Join on Home Web Wiring Network," Associated Press Online printed on Apr. 30, 2008 (Jun. 2000).

Tang et al., "Thread Partitioning and Scheduling Based on Cost Model," Proceedings of the Ninth Annual ACM Symposium on Parallel Algorithms and Architectures, pp. 272-281 Retrieved from: http://doi.acm.org/10.1145/258492.2585 retrieved on Aug. 25, 2004 (1997).

Vaya, "VITURBO: A Reconfigurable Architecture for Ubiquitous Wireless Networks," A Thesis Submitted in Partial Fulfillment of the Requirements for the Degree Master of Science; Rice University (Aug. 2002).

Wang et al., "Cell Search in W-CDMA," IEEE Journal on Selected Areas in Communications 18(8):1470-1482 (Aug. 2000).

Wardell, "Help for Hurried Cooks?," Popular Science, p. 32 (May 2000).

Whiting & Pascoe, "A History of Data-Flow Languages," IEEE Annals of the History of Computing 16(4):38-59 (1994).

Williamson & Lee, "Synthesis of Parallel Hardware Implementations from Synchronous Dataflow Graph Specifications," Conference Record of the Thirtieth Asilomar Conference on Signals, Systems and Computers 1340-1343 (Nov. 1996).

Wirthlin et al., "A Dynamic Instruction Set Computer," Proceedings of the IEEE Symposium on FPGA's for Custom Computing Machines, pp. 99-107 (Apr. 21, 1995).

WWW.APPLIANCEMAGAZINE.COM, World Wide Web at http://web.archive.org/web/20000511085402/http://www.appliancemagazine.com/ printed on Apr. 30, 2008.

WWW.BESTROM.COM, BreakMateTM from www.bestrom.com printed on Apr. 29, 2008.

WWW.BEVERAGEEXPRESS.COM, Beverage Express from www.beverageexpress.com printed on Apr. 30, 2008.

WWW.BEVSTAR.COM, Isoworth Beverage Dispensing Technology Worldwide from www.bevstar.com printed on Apr. 30, 2008.

WWW.BONATOR.COM, from the World Wide Web at http://web.archive.org/web/20000510102440/http://www.bonator.com/ printed on Apr. 30, 2008.

WWW.ECOMMERCE.DEWPOINTINC.COM, Swiss Mountain Coffees from www.ecommerce.dewpointinc.com printed on Apr. 30, 2008.

WWW.GATEWAY.COM, World Wide Web, http://web.archive.org/web/20000229192734/www.gateway.com/productpages/9300splash/index.shtml Available on Mar. 3, 2000, 1 page (Mar. 3, 2000).

WWW.ICL.COM, from the World Wide Web at http://www.icl.com printed on Apr. 30, 2008.

WWW.MARGHERITA2000.COM; from Margherita2000.com printed Apr. 30, 2008 (Jan. 26, 2001).

WWW.SODACLUBENTERPRISES.COM, Soda-Club Enterprises from www.sodaclubenterprises.com printed on Apr. 30, 2008.

WWW.SYMBOL.COM, Symbol from www.symbol.com printed on Apr. 30, 2008.

WWW.WUNDERBAR.COM, Wunder-Bar Dispensing Systems from www.wunderbar.com printed on Apr. 30, 2008.

Xilinx, "Virtex-II Pro Platform FPGAs: Functional Description DS083-2 (v2.5)," Product Specification, pp. 13-46 (Jan. 20, 2003).

Young, "Architecture Powers up IPSec, SSL," EETimes, Los Gatos, CA, pp. 1-4 http://www.eetimes.com/story/OEG20011102S0065 (Nov. 2, 2001).

Yuan et al., "A Decomposition Approach to Non-Preemptive Real-Time Scheduling," Real Time Systems 6(1):7-35 (1994).

Zaino et al., "Algorithm Analysis and Mapping Environment for Adaptive Computing Systems," Final Technical Report, DARPA Contract F33615-97-C-1174 (Sep. 2001).

Zhang et al., "A 1V Heterogeneous Reconfigurable Processor IC for Baseband Wireless Applications," 2000 IEEE Solid.

* cited by examiner

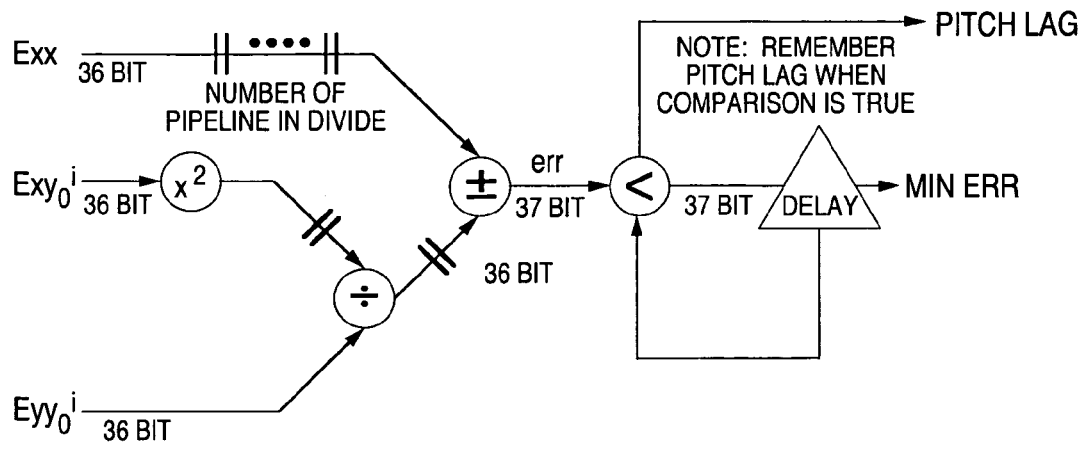
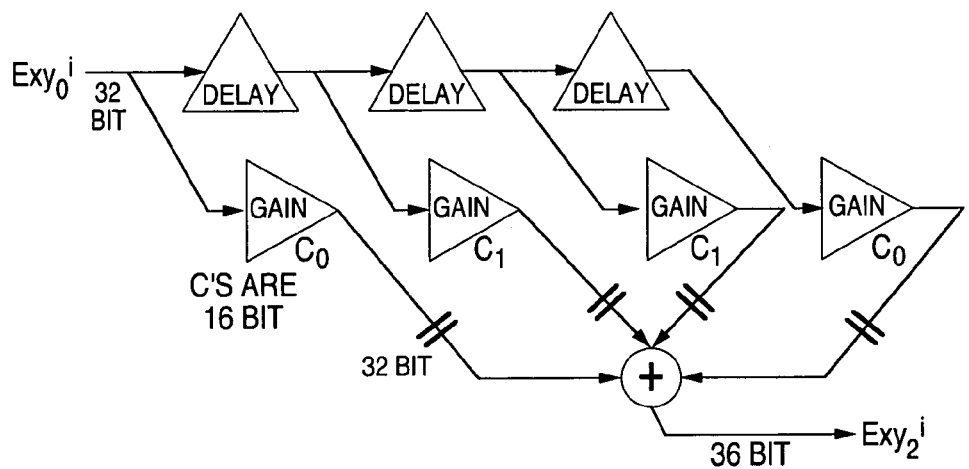
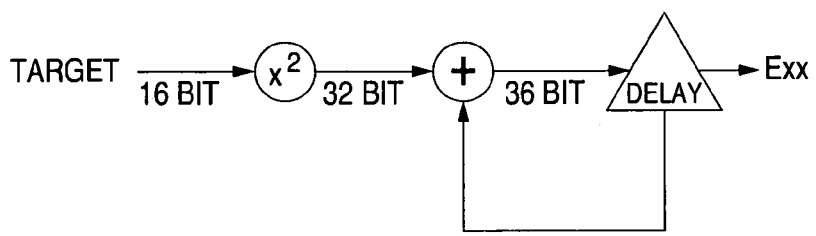
FIG. 5E

METHOD AND SYSTEM FOR CREATING AND PROGRAMMING AN ADAPTIVE COMPUTING ENGINE

CROSS REFERENCE TO RELATED APPLICATIONS

This application is a continuation of U.S. patent application Ser. No. 10/437,800, filed May 13, 2003, which claims priority to U.S. Provisional application Ser. No. 60/378,088, filed May 13, 2002. The disclosures of each of the aforementioned applications are hereby incorporated by reference in their entirety as if set forth in full herein for all purposes.

FIELD OF INVENTION

The present invention relates to adaptive computing machines, and more particularly to creating and programming an adaptive computing engine.

BACKGROUND OF THE INVENTION

The electronics industry has become increasingly driven to meet the demands of high-volume consumer applications, which comprise a majority of the embedded systems market. Examples of consumer applications where embedded systems are employed include handheld devices, such as cell phones, personal digital assistants (PDAs), global positioning system (GPS) receivers, digital cameras, etc. By their nature, these devices are required to be small, low-power, light-weight, and feature-rich. Thus, embedded systems face challenges in producing performance with minimal delay, minimal power consumption, and at minimal cost. As the numbers and types of consumer applications where embedded systems are employed increases, these challenges become even more pressing.

Each of these applications typically comprises a plurality of algorithms which perform the specific function for a particular application. An algorithm typically includes multiple smaller elements called algorithmic elements which when performed produce a work product. An example of an algorithm is the QCELP (QUALCOMM Code Excited Linear Prediction) voice compression/decompression algorithm which is used in cell phones to compress and decompress voice in order to save wireless spectrum.

Conventional systems in hardware architectures provide a specific hardware accelerator typically for one or two algorithmic elements. This has typically sufficed in the past since most hardware acceleration has been performed in the realm of infrastructure base stations. There, many channels are processed (typically 64 or more) and having one or two hardware accelerations, which help accelerate the two algorithmic elements, can be justified. Best current practices are to place a Digital Signal Processing IC alongside the specific hardware acceleration circuitry and then arraying many of these together in order to process the workload. Since any gain in performance or power dissipation is multiplied by the number of channels (64), this approach is currently favored.

For example, in a base station implementation of the QCELP algorithm acceleration the pitch computation will result in a 20% performance/power savings per channel. 20% of the processing which is done across 64 channels results in a significantly large performance/power savings.

The shortcomings with this approach are revealed when attempts are made to accelerate an algorithmic element in a mobile terminal. There typically is only a single channel is processed and for significant performance and power saving to be realized then many algorithmic elements must be accelerated. The problem, however, is that the size of the silicon is bounded by cost constraints and a designer can not justify added specific acceleration circuitry for every algorithmic element. However, the QCELP algorithm itself consists of many individual algorithm elements (17 of the most frequently used algorithmic elements):

1. Pitch Search Recursive Convolution
2. Pitch Search Autocorrelation of Exx
3. Pitch Search Correlation of Exy
4. Pitch Search Autocorrelation of Eyy
5. Pitch Search Pitch Lag and Minimum Error
6. Pitch Search Sinc Interpolation of Exy
7. Pitch Search Interpolation of Eyy
8. Codebook Search Recursive convolution
9. Codebook Search Autocorrelation of Eyy
10. Codebook Search Correlation of Exy
11. Codebook Search Codebook index and Minimum Error
12. Pole Filter
13. Zero Filter
14. Pole 1 Tap Filter
15. Cosine
16. Line Spectral Pair Zero search
17. Divider For example, in a mobile terminal implementation of the QCELP algorithm, if the pitch computation is accelerated, the performance/power dissipation is reduced by 20% for an increased cost of silicon area. By itself, the gain for the cost is not economically justifiable. However, if for the cost in silicon area of a single accelerator there was an IC that can adapt itself in time to be able to become the accelerator for each of the 17 algorithmic elements, it would be 80% of the cost for a single adaptable accelerator.

Normal design approaches for embedded systems tend to fall in one of three categories: an ASIC (application specific integrated circuit) approach; a microprocessor/DSP (digital signal processor) approach; and an FPGA (field programmable gate array) approach. Unfortunately, each of these approaches has drawbacks. In the ASIC approach, the design tools have limited ability to describe the algorithm of the system. Also, the hardware is fixed, and the algorithms are frozen in hardware. For the microprocessor/DSP approach, the general-purpose hardware is fixed and inefficient. The algorithms may be changed, but they have to be artificially partitioned and constrained to match the hardware. With the FPGA approach, use of the same design tools as for the ASIC approach result in the same problem of limited ability to describe the algorithm. Further, FPGAs consume significant power and are too difficult to reconfigure to meet the changes of product requirements as future generations are produced.

An alternative is to attempt to overcome the disadvantages of each of these approaches while utilizing their advantages. Accordingly, what is desired is a system in which more efficient consumer applications can be created and programmed than when utilizing conventional approaches.

SUMMARY OF THE INVENTION

A system for creating an adaptive computing engine (ACE) is disclosed. The system comprises a plurality of algorithmic elements capable of being configured into an adaptive computing engine, and means for mapping the operations of the plurality of algorithmic elements to non-homogenous nodes by using computational and data analysis. The system and method also includes means for utilizing the mapped algorithmic elements to provide the appropriate hardware function. A system and method in accordance with the present invention provides the ability to bring into existence efficient hardware accelerators for a particular algorithmic element and then to reuse the same silicon area to bring into existence a new hardware accelerator for the next algorithmic element.

With the ability to optimize operations of an ACE in accordance with the present invention, an algorithm is allowed to run on the most efficient hardware for the minimum amount of time required. Further, more adaptability is achieved for a wireless system to perform the task at hand during run time. Thus, algorithms are no longer required to be altered to fit predetermined hardware existing on a processor, and the optimum hardware required by an algorithm comes into existence for the minimum time that the algorithm needs to run.

BRIEF DESCRIPTION OF THE DRAWINGS

FIGS. 5A-5F illustrate dataflow graphs for QCELP operations.

DETAILED DESCRIPTION OF THE INVENTION

The present invention provides a method and system for optimizing operations of an ACE. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiments shown but is to be accorded the widest scope consistent with the principles and features described herein.

An approach that is dynamic both in terms of the hardware resources and algorithms is emerging and is referred to as an adaptive computing engine (ACE) approach. ACEs can be reconfigured upwards of hundreds of thousands of times a second while consuming very little power. The ability to reconfigure the logical functions inside the ACE at high speed and "on-the-fly", i.e., while the device remains in operation, describes the dynamic hardware resource feature of the ACE. Similarly, the ACE operates with dynamic algorithms, which refers to algorithms with constituent parts that have temporal elements and thus are only resident in hardware for short portions of time as required.

Figure 1:
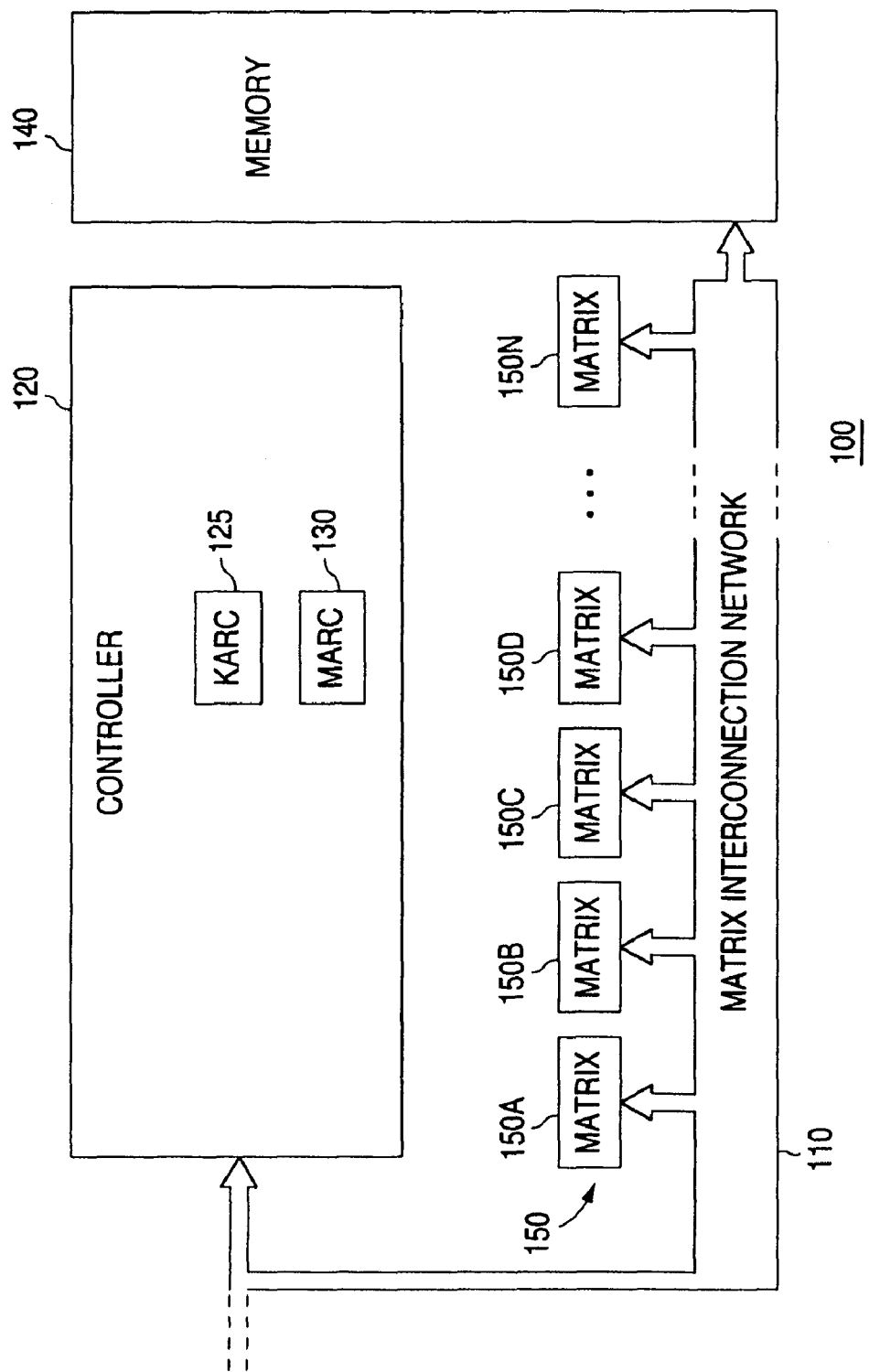
FIG. 1 is a block diagram illustrating a preferred apparatus in accordance with the present invention.

While the advantages of on-the-fly adaptation in ACE approaches are easily demonstrated, a need exists for a tool that supports optimizing of the ACE architecture for a particular problem space. FIG. 1 is a block diagram illustrating a preferred apparatus 100 in accordance with the present invention. The apparatus 100, referred to herein as an adaptive computing machine ("ACE") 100, is preferably embodied as an integrated circuit, or as a portion of an integrated circuit having other, additional components. In the preferred embodiment, and as discussed in greater detail below, the ACE 100 includes a controller 120, one or more reconfigurable matrices 150, such as matrices 150A through 150N as illustrated, a matrix interconnection network 110, and preferably also includes a memory 140.

A significant departure from the prior art, the ACE 100 does not utilize traditional (and typically separate) data and instruction busses for signaling and other transmission between and among the reconfigurable matrices 150, the controller 120, and the memory 140, or for other input/output ("I/O") functionality. Rather, data, control and configuration information are transmitted between and among these elements, utilizing the matrix interconnection network 110, which may be configured and reconfigured, in real-time, to provide any given connection between and among the reconfigurable matrices 150, the controller 120 and the memory 140, as discussed in greater detail below.

The memory 140 may be implemented in any desired or preferred way as known in the art, and may be included within the ACE 100 or incorporated within another IC or portion of an IC. In the preferred embodiment, the memory 140 is included within the ACE 100, and preferably is a low power consumption random access memory (RAM), but also may be any other form of memory, such as flash, DRAM, SRAM, MRAM, ROM, EPROM or EEPROM. In the preferred embodiment, the memory 140 preferably includes direct memory access (DMA) engines, not separately illustrated.

The controller 120 is preferably implemented as a reduced instruction set ("RISC") processor, controller or other device or IC capable of performing the two types of functionality discussed below. The first control functionality, referred to as "kernel" control, is illustrated as kernel controller ("KARC") 125, and the second control functionality, referred to as "matrix" control, is illustrated as matrix controller ("MARC") 130. The control functions of the KARC 125 and MARC 130 are explained in greater detail below, with reference to the configurability and reconfigurability of the various matrices 150, and with reference to the preferred form of combined data, configuration and control information referred to herein as a "silverware" module.

The matrix interconnection network 110 of FIG. 1, and its subset interconnection networks collectively and generally referred to as "interconnect", "interconnection(s)" or "interconnection network(s)", may be implemented as known in the art, such as utilizing the interconnection networks or switching fabrics of FPGAs, albeit in a considerably more limited, less "rich" fashion, to reduce capacitance and increase speed of operation. In the preferred embodiment, the various interconnection networks are implemented as described, for example, in U.S. Pat. Nos. 5,218,240, 5,336, 950, 5,245,277 and 5,144,166. These various interconnection networks provide selectable (or switchable) connections between and among the controller 120, the memory 140, the various matrices 150, providing the physical basis for the configuration and reconfiguration referred to herein, in response to and under the control of configuration signaling generally referred to herein as "configuration information". In addition, the various interconnection networks including 110 and the interconnection networks within each of the matrices (not shown) provide selectable or switchable data, input, output, control and configuration paths, between and among the controller 120, the memory 140, the various matrices 150, and the computational units (not shown) and computational elements (not shown) within the matrices 150, in lieu of any form of traditional or separate input/output busses, data busses, and instruction busses.

The various matrices 150 are reconfigurable and heterogeneous, namely, in general, and depending upon the desired configuration: reconfigurable matrix 150A is generally different from reconfigurable matrices 150B through 150N;

reconfigurable matrix 150B is generally different from reconfigurable matrices 150A and 150C through 150N; reconfigurable matrix 150C is generally different from reconfigurable matrices 150A, 150B and 150D through 150N, and so on. The various reconfigurable matrices 150 each generally contain a different or varied mix of computation units, which in turn generally contain a different or varied mix of fixed, application specific computational elements, which may be connected, configured and reconfigured in various ways to perform varied functions, through the interconnection networks. In addition to varied internal configurations and reconfigurations, the various matrices 150 may be connected, configured and reconfigured at a higher level, with respect to each of the other matrices 150, through the matrix interconnection network 110.

Figure 2:
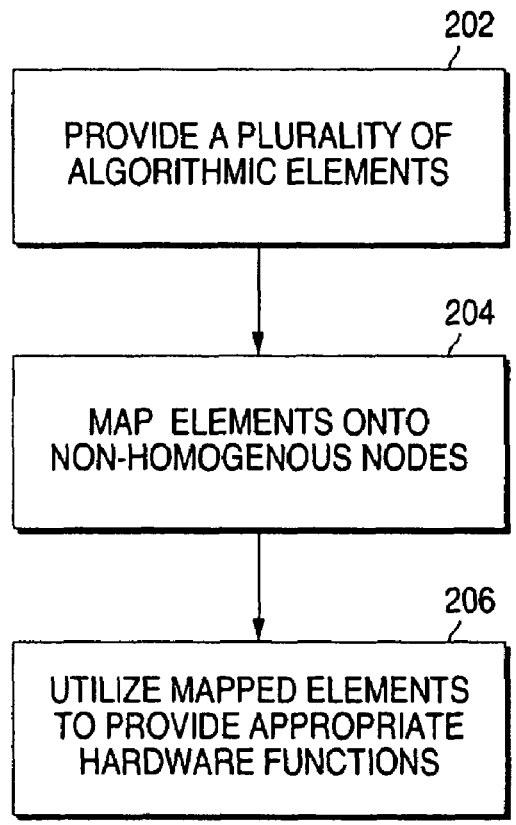
FIG. 2 illustrates a simple flow chart of providing an ACE in accordance with the present invention.

FIG. 2 illustrates a simple flow chart of providing an ACE in accordance with the present invention. First, a plurality of algorithmic elements are provided, via step 202. Next, the algorithmic elements are mapped onto non-homogeneous, i.e., heterogeneous, nodes by using data and computational analyses, via step 204. Finally, the mapped algorithmic elements within the node are utilized to provide the appropriate hardware function, via step 206. In a preferred embodiment, the algorithmic elements within a node are segmented to over optimize performance. The segmentation can either be spacial, that is, ensuring elements are close to each other or the segmentation can be temporal, that is, the elements come into existence at different points in time.

Figure 3:
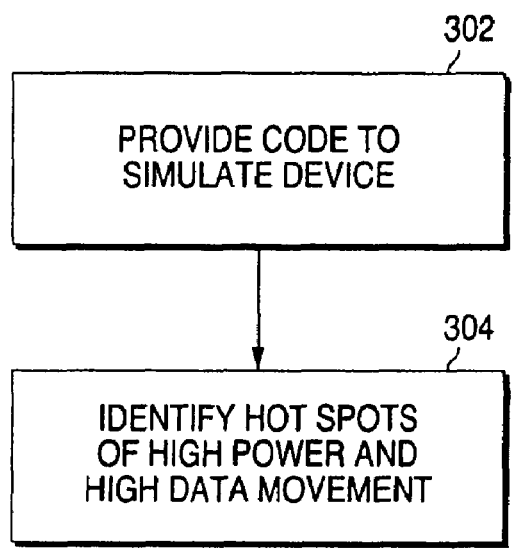
FIG. 3 is a flow chart which illustrates the operation of the profiler in accordance with the present invention.

The data and computational and analysis of the algorithmic mapping step 204 is provided through the use of a profiler. The operation of the profiler is described in more detail herein below in conjunction with the accompanying figure. FIG. 3 is a flow chart which illustrates the operation of the profiler in accordance with the present invention.

First code is provided to simulate the device, via step 302. From the design code hot spots are identified, via step 304. Hot spots are those operations which utilize high power and/or require a high amount of movement of data (data movement). The identification of hot spots, in particular the identification of data movement is important in optimizing the performance of the implemented hardware device. A simple example of the operation of the profiler is described below.

A code that is to be profiled is shown below:

```
line 1: for ( i = 0 to 1023 ) {        // do this loop 1024 times
line 2:     x[i] = get data from producer A   // fill up an array of 1024
line 3: }
line 4:
line 5: for ( ;; )                     // do this loop forever
line 6:     sum = 0                    // initialize variable sum
line 7:     temp = get data from producer B   // get a new value
line 8:     for (j = 0 to 1023 ) {     // do this loop 1024 times
line 9:         sum = sum + x[i] * temp    // perform multiply
                                            accumulate
line 10:    }
line 11:    send sum to consumer C     // send sum
line 12: }
```

This illustrates three streams of data, producer A on line 2, producer B on line 7 and a consumer of data on line 11. The producers or consumers may be variables, may be pointers, may be arrays, or may be physical devices such as Analog to Data Converters (ADC) or Data to Analog Converters (DAC). Traditional profilers would identify line 8 as a computational hot spot—an area of the code which consumes large amounts of computations. Line 8 consists of a multiply followed by an accumulation which, on some hardware architecture may take many clock cycles to perform. What this invention will identify which is not performed in existing profiles is identify not only the computation hot spots, but also memory hot spots as well as data movement hotspots. Line 7 and line 11 are identified as data movement hot spots since the data will be input from the producer B on line 7 and the sum will be sent to consumer C in line 11. Also identified by the profiler as a secondary data movement hot spot is line 2 where 1024 values from Producer A will be moved into the array X. Finally, line 9 is identified as a data movement hot spot since an element of the array x and the temp value are summed with the variable sum and the result placed back into the variable sum. The profile will also identify on line 9, the array x, as a memory hotspot followed, secondarily, by line 2, array x, as a memory hotspot.

With this information from the profiler, the ACE can instantiate the following hardware circuitry to accelerate the performance as well as lower the power dissipation of this algorithmic fragment (algorithmic element) by putting the building block elements together. Data movements will be accelerated by constructing from the low level ACE building blocks DMA (Direct Memory Address) hardware to perform the data movement on lines 2, 9, 7, and 11. A specific hardware accelerator to perform the computation on line 9 will be constructed from the lower level ACE building blocks to construct a Multiply Accumulate hardware accelerator. Finally, the information from the profiler on the memory hot spots on lines 2 and 9 will allow the ACE to either build a memory array of exactly 1024 elements from the low level ACE building blocks or ensure that the smallest possible memory which can fit 1024 elements is used. Optimal sizing of memory is mandatory to ensure low power dissipation. In addition, the profiling information on the memory hot spot on line 9 is used to ensure that the ACE will keep the circuitry for the multiply accumulate physically local to the array x to ensure the minimum physical distance which is directly proportional to the effective capacitance—the greater the distance between where data is kept and where data is processed means greater capacitance, which is one of the prime elements which dictates power consumption.

The resources needed for implementing the algorithmic elements specify the types of composite blocks needed for a given problem, the number of each of the types that are needed, and the number of composite blocks per minimatrix. The composite blocks and their types are preferably stored in a database. By way of example, one type of composite block may be labeled linear composite blocks and include multipliers, adders, double adders, multiply double accumulators, radix 2, DCT, FIR, IIR, FFT, square root, divides. A second type may include Taylor Series approximation, CORDIC, sines, cosines, polynomial evaluations. A third type may be labeled FSM (finite status machine) blocks, while a fourth type may be termed FPGA blocks. Bit processing blocks may form a fifth type, and memory blocks may form a sixth type of composite block.

Figure 4:
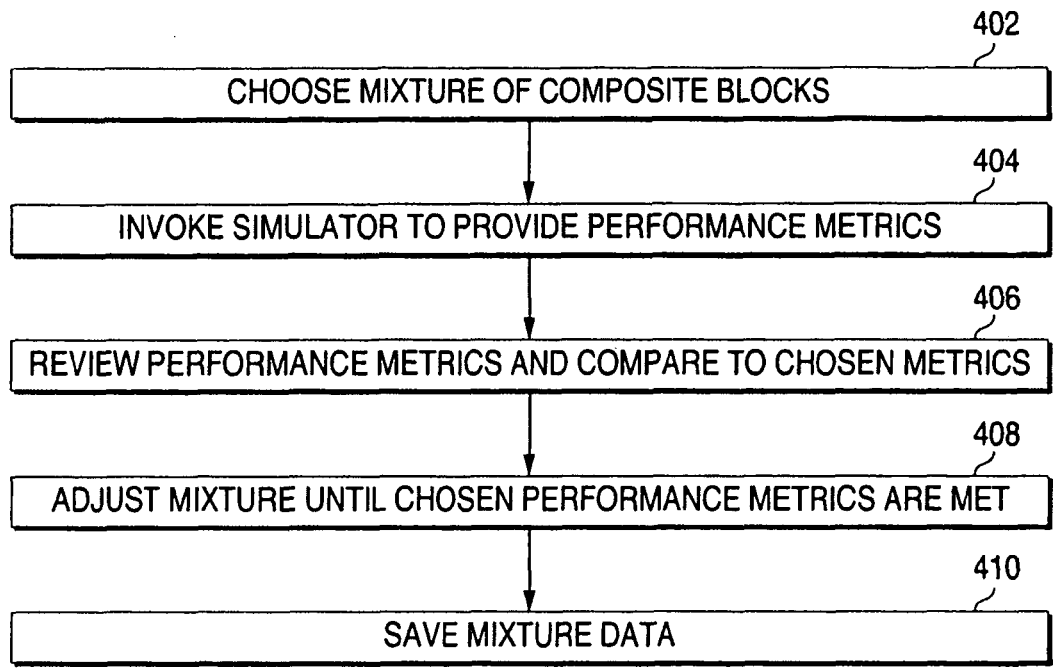
FIG. 4 is a flow chart which illustrates optimizing the mixture of composite blocks.

FIG. 4 is a flow chart which illustrates optimizing the mixture of composite blocks. First, a mixture of composite blocks is chosen, via step 402. Given a certain mixture of composite blocks, composite block types, and interconnect density, a simulator/resource estimator/scheduler is invoked to provide performance metrics, via step 404. In essence, the performance metrics determine the efficiency of the architecture to meet the desired goal. Thus, the operations by the designated hardware resources are simulated to identify the metrics of the combination of composite blocks. The metrics produced by the simulation are then reviewed to determine whether they meet the chosen performance metrics, via step 406. When the chosen performance metrics are not met, the combination of resources provided by the composite blocks is adjusted until the resulting metrics are deemed good enough, via step 408. By way of example, computation power efficiency (CPE) refers to the ratio of the number of gates actively working in a clock cycle to the total number of gates in the device. A particular percentage for CPE can be chosen as a performance metric that needs to be met by the combination of composite blocks.

Once the chosen performance metrics are met, the information about which composite blocks were combined to achieve the particular design code is stored in a database, via step 410. In this manner, subsequent utilization of that design code to optimize an ACE is realized by accessing the saved data. For purposes of this discussion, these combinations are referred to as dataflow graphs. FIGS. 5A-5F illustrate dataflow graphs for QCELP operations.

Figure 6:
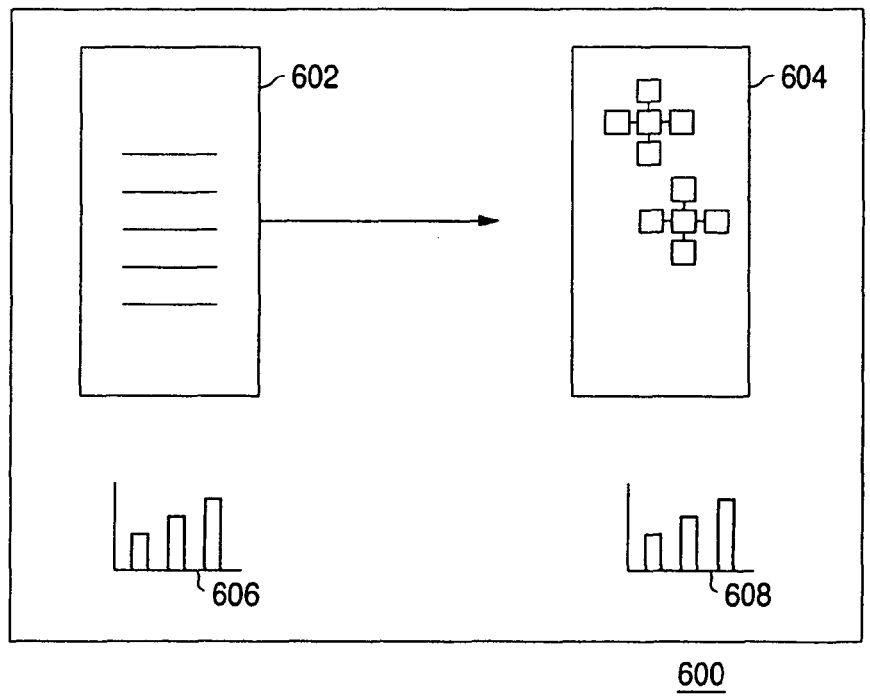
FIG. 6 illustrates an integrated environment in accordance with the present invention.
Figure 5A:
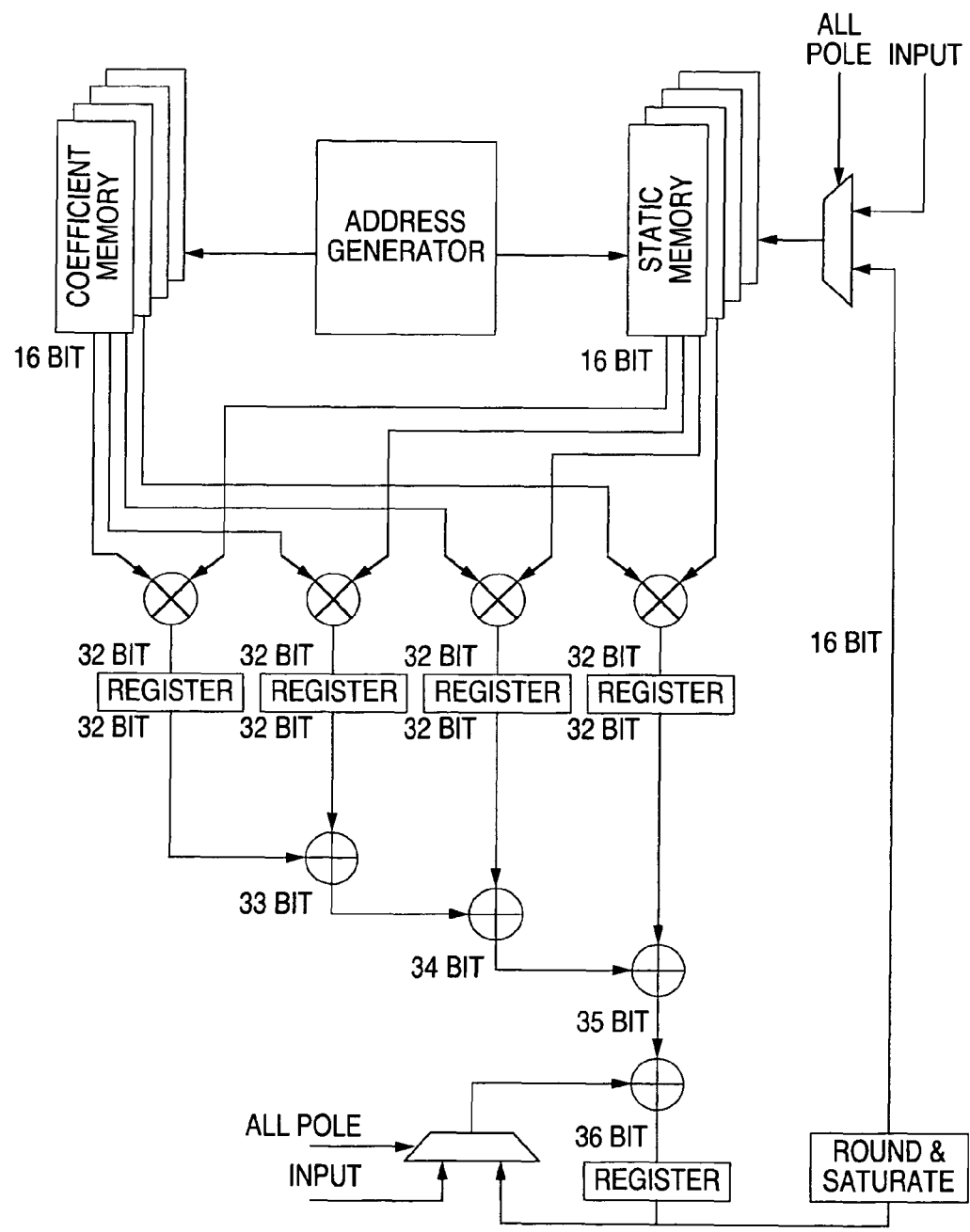
Figure 5B:
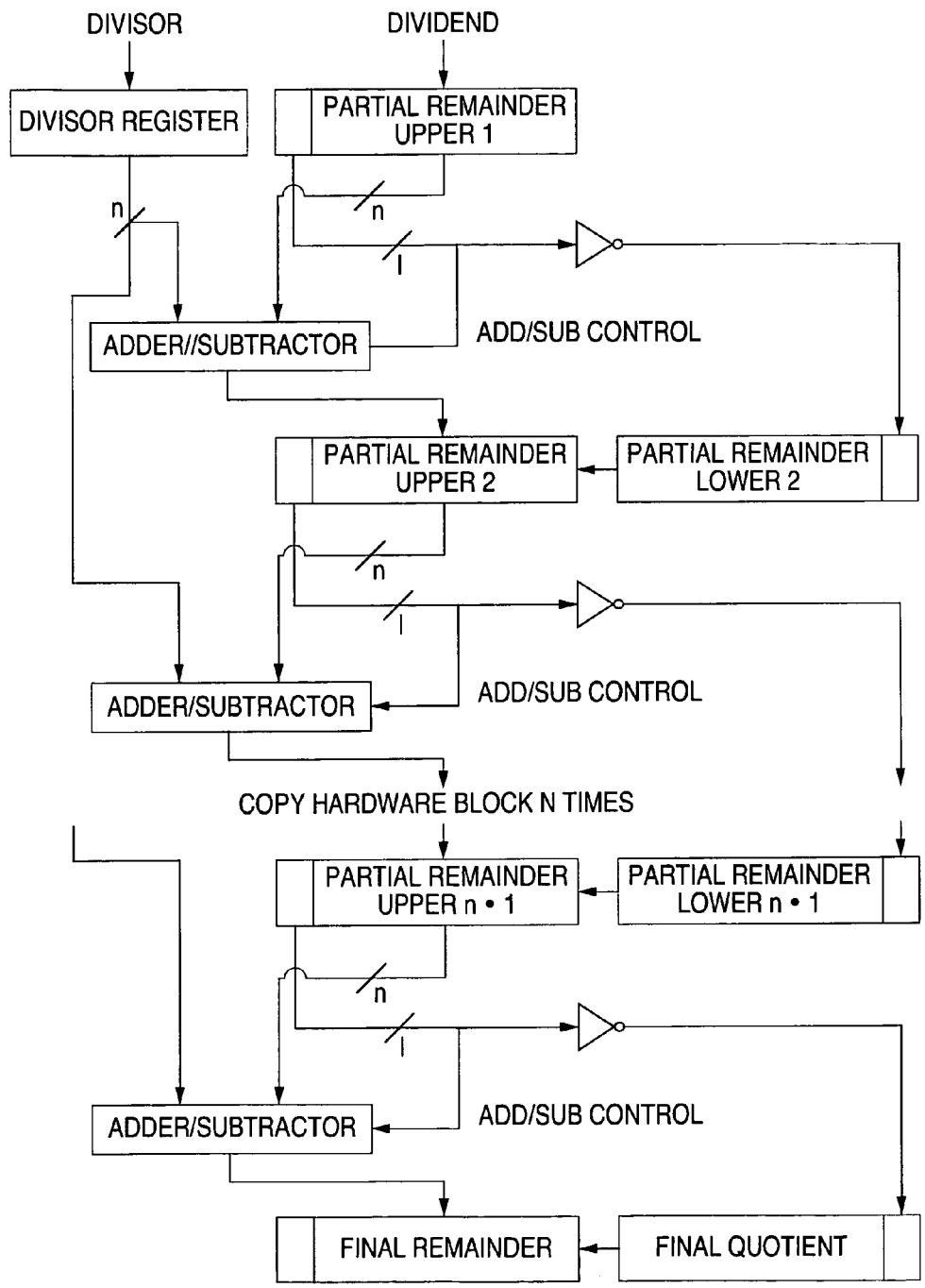
Figure 5C:
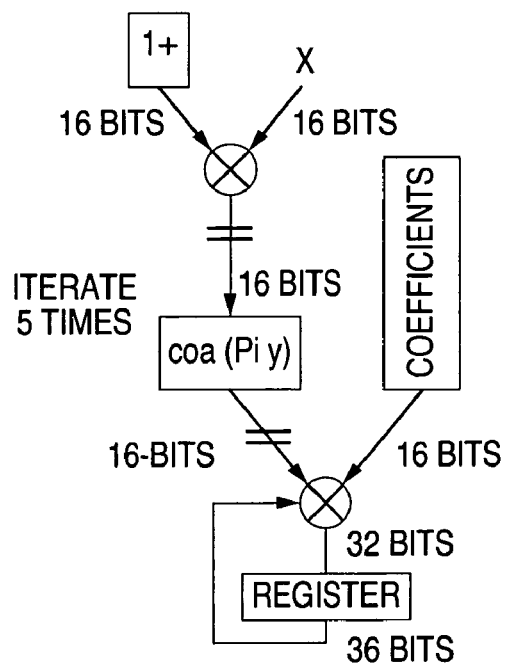
Figure 5D:
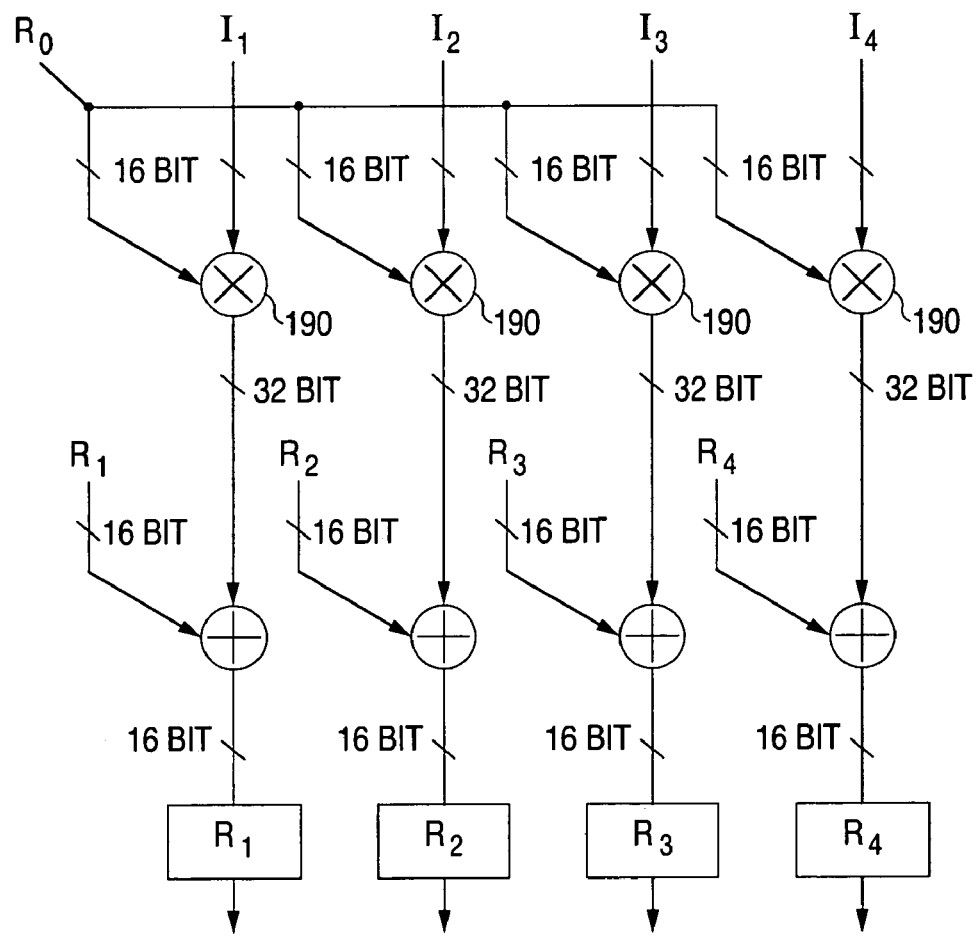
Figure 5F:
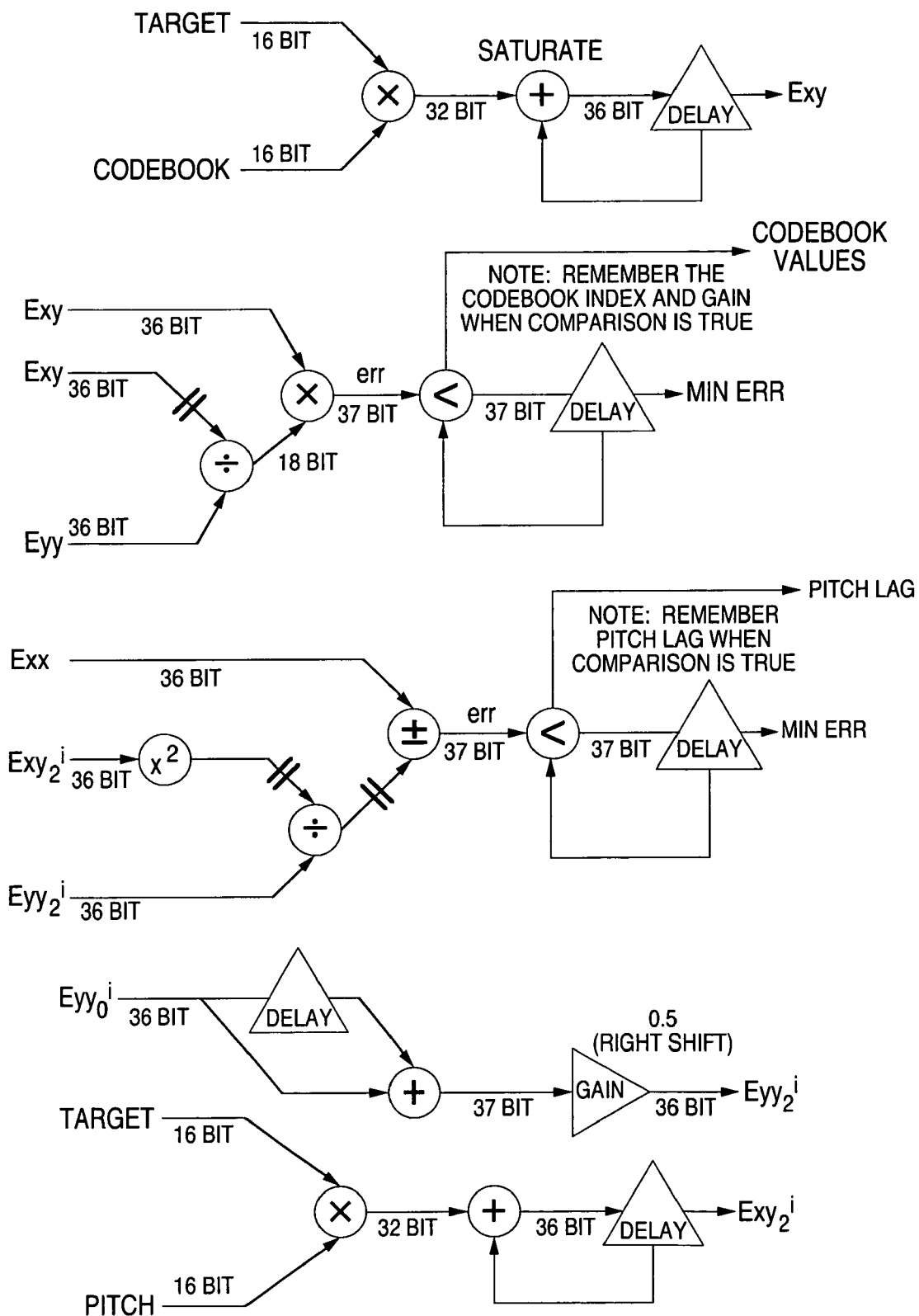

To implement the flow chart of FIG. 4, an integrated environment is provided to allow a user to make the appropriate tradeoffs between power performance and data movement. FIG. 6 illustrates an integrated environment 600 in accordance with the present invention. A legacy code of a typical design on one chart 602 is provided alongside the corresponding ACE architecture on the other chart 604. Power, performance and data movement readings are provided at the bottom of each of the charts; illustrated at 606 and 608, respectively. In a preferred embodiment, it would be possible to drag and drop code from the legacy chart 602 onto one of the mini-matrices of the ACE chart 604. In a preferred embodiment, there would be immediate feedback, that is, as a piece of code was dropped on the ACE chart 604, the power energy and data movement reading would change to reflect the change. Accordingly, an ACE which is optimized for a particular performance can be provided through this process.

As mentioned before, the ACE can be segmented spatially and temporally to ensure that a particular task is performed in the optimum manner. By adapting the architecture over and over, a slice of ACE material builds and dismantles the equivalent of hundreds or thousands of ASIC chips, each optimized to a specific task. Since each of these ACE "architectures" is optimized so explicitly, conventional silicon cannot attempt its recreation, conventional ASIC chips would be far too large, and microprocessors/DSPs far too customized. Further, the ACE allows software algorithms to build and then embed themselves into the most efficient hardware possible for their application. This constant conversion of "software" into "hardware" allows algorithms to operate faster and more efficiently than with conventional chip technology. ACE technology also extends conventional DSP functionality by adding a greater degree of freedom to such applications as wireless designs that so far have been attempted by changing software.

Adapting the ACE chip architecture as necessary introduces many new system features within reach of a single ACE-based platform. For example, with an ACE approach, a wireless handset can be adapted to become a handwriting or voice recognition system or to do on-the-fly cryptography. The performance of these and many other functions at hardware speeds may be readily recognized as a user benefit while greatly lowering power consumption within battery-driven products.

In a preferred embodiment, the hardware resources of an ACE are optimized to provide the necessary resources for those parts of the design that most need those resources to achieve efficient and effective performance. By way of example, the operations of a vocoder, such as the QCELP, provide a design portion of a cellular communication device that benefits from the optimizing of an ACE. As a vector quantizer-based speed codec, a QCELP coding speech compression engine has eight inner loops/algorithms that consume most of the power. These eight algorithms include code book search, pitch search, line spectral pairs (LSP) computation, recursive convolution and four different filters. The QCELP engine thus provides an analyzer/compressor and synthesizer/decompressor with variable compression ranging from 13 to 4 kilobits/second (kbit/s).

With the analyzer operating on a typical DSP requiring about 26 MHz of computational power, 90 percent of the power and performance is dissipated by 10 percent of the code, since the synthesizer needs only about half that performance. For purposes of this disclosure, a small portion of code that requires a large portion of the power and performance dissipated is referred to as a hot spot in the code. The optimization of an ACE in accordance with the present invention preferably occurs such that it appears that a small piece of silicon is time-sliced to make it appear as an ASIC solution in handling the hot spots of coding. Thus, for the example QCELP vocoder, when data comes into the QCELP speech codec every 20 milliseconds, each inner loop is applied 50 times a second. By optimizing the ACE, the hardware required to run each inner loop algorithm 400 times a second is brought into existence.

With the ability to optimize operations of an ACE in accordance with the present invention, an algorithm is allowed to run on the most efficient hardware for the minimum amount of time required. Further, more adaptability is achieved for a wireless system to perform the task at hand during run time. Thus, algorithms are no longer required to be altered to fit predetermined hardware existing on a processor, and the optimum hardware required by an algorithm comes into existence for the minimum time that the algorithm needs to run.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for creating a configuration for an adaptive computing engine (ACE) having a plurality of heterogeneous nodes having hardware elements, the system comprising:
   an algorithmic elements stored in a database;
   composite ACE building block types;
   means for creating a configuration for at least some of the heterogeneous nodes of the ACE to provide appropriate hardware circuit functions that implement the algorithmic element, by selecting an initial set of the composite ACE building block types required to implement the algorithmic element, and configuring the hardware elements on at least one of the heterogeneous nodes according to the selected initial set of composite ACE building block types; and
   means for optimizing the configuration for the heterogeneous nodes by selecting a different set of the composite ACE building block types required to implement the algorithmic element that meets predetermined performance standards for efficiency of the ACE when performance of the ACE is simulated.

2. The system of claim 1, wherein the composite ACE building block types belong to at least one of a plurality of composite ACE building blocks types including linear computation block types, finite state machine block types, field programmable gate array block types, processor block types, and memory block types.

3. The system of claim 2, wherein the linear computation block types are selected from the group consisting of: multipliers, adders, double adders, multiply double accumulators, radix 2, discrete cosine transform (DCT), finite impulse response (FIR), infinite impulse response (IIR), Fast Fourier Transform (FFT), square root, and divides.

4. The system of claim 1, wherein the means for creating a design further includes a profiler that comprises:
means for providing code to simulate a hardware design that implements the algorithmic elements; and
means for identifying one or more hot spots in the code, wherein the identified hot spots are those areas of code requiring high power and/or high data movement; and
wherein the means for creating a design selects the initial set of the composite ACE building block types based on the identified hot spots.

5. The system of claim 4, wherein each hot spot comprises a computational hot spot or a data movement hot spot.

6. The system of claim 5, wherein the means for creating a design uses each data movement hot spot to restrict high data movements to a minimum physical distance in the ACE.

7. The system of claim 1, wherein the hardware elements of the heterogeneous nodes are coupled with each other by a configurable and reconfigurable interconnection network.

8. The system of claim 7, wherein the heterogeneous nodes are configurable and reconfigurable to provide appropriate hardware circuit functions for implementing the algorithmic elements by configuring and reconfiguring the reconfigurable interconnection network coupling the hardware elements.

9. The system of claim 1, wherein the composite ACE building block types are stored in a database.

10. The system of claim 1, wherein the different set of composite ACE building block types that meets the predetermined performance standards for efficiency of the ACE when performance of the ACE is simulated is stored in a database.

11. The method of claim 1, wherein the ACE is reconfigured to perform a different algorithmic element via selecting another set of composite ACE building block types and configuring the hardware elements one at least one of the heterogeneous nodes according to the another set of composite ACE building block types.

12. A method for creating a configuration for an adaptive computing engine (ACE) having a plurality of heterogeneous nodes, each heterogeneous node including a plurality of hardware elements, the method comprising:
providing an algorithmic elements;
providing composite ACE building block types;
creating a configuration for at least some of the heterogeneous nodes of the ACE to provide appropriate hardware circuit functions that implement the algorithmic elements comprising:
selecting an initial set of the composite ACE building block types required to implement the algorithmic element;
configuring the hardware elements on at least one of the heterogeneous nodes according to the selected initial set of composite ACE building block types; and
optimizing the design for the heterogeneous nodes comprising:
simulating performance of the ACE;
selecting a different set of the composite building block types required to perform the algorithmic element that meets predetermined performance standards for efficiency of the ACE when performance of the ACE is simulated by a computer.

13. The method of claim 12, wherein the composite building block types belong to at least one of a plurality of composite ACE building blocks types including linear computation block types, finite state machine block types, field programmable gate array block types, processor block types, and memory block types.

14. The method of claim 13, wherein the linear computation block types are selected from the group consisting of: multipliers, adders, double adders, multiply double accumulators, radix 2, discrete cosine transform (DCT), finite impulse response (FIR) infinite impulse response (IIR), Fast Fourier Transform (FFT), square root, and divides.

15. The method of claim 12, wherein the creating a design further includes profiling using a profiler, wherein the profiling comprises:
providing code to simulate a hardware design that implements the algorithmic elements; and
identifying one or more hot spots in the code, wherein the identified hot spots are those areas of code requiring high power and/or high data movement; and
wherein the creating a design further comprises selecting the initial set of the composite ACE building block types based on the identified hot spots.

16. The method of claim 15, wherein each hot spot comprises a computational hot spot or a data movement hot spot.

17. The method of claim 16, wherein the creating a design uses each data movement hot spot to restrict high data movements to a minimum physical distance in the ACE.

18. The method of claim 12, wherein the hardware elements of the heterogeneous nodes of the ACE are coupled with each other by a configurable and reconfigurable interconnection network.

19. The method of claim 18, wherein the heterogeneous nodes of the ACE are configurable and reconfigurable to provide appropriate hardware circuit functions for implementing the algorithmic elements by configuring and reconfiguring the interconnection network and the hardware elements.

20. The method of claim 12, wherein the composite ACE building blocks types are stored in a database.

21. The method of claim 12, further comprising storing in a database the different set of composite ACE building block types that meets the predetermined performance standards for efficiency of the ACE when performance of the ACE is simulated.

* * * * *